(12) United States Patent
Nishida et al.

(10) Patent No.: US 6,191,974 B1
(45) Date of Patent: Feb. 20, 2001

(54) NONVOLATILE SEMICONDUCTOR MEMORY

(75) Inventors: Yoichi Nishida, Fukuoka; Tomonori Kataoka, Oonojo; Ikuo Fuchigami; Tomoo Kimura, both of Fukuoka; Junji Michiyama, Kasuya-gun; Satoshi Koutaka, Kumamoto, all of (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 09/321,092

(22) Filed: May 27, 1999

(51) Int. Cl.[7] .................................................. G11C 16/04
(52) U.S. Cl. ................ 365/185.11; 365/233; 365/230.03
(58) Field of Search ............................... 365/233, 230.03, 365/185.11

(56) References Cited

U.S. PATENT DOCUMENTS 5,892,730 * 4/1999 Sato et al. ............................ 365/233
5,903,514 * 5/1999 Sawada ................................ 365/233
5,956,285 * 9/1999 Watanabe et al. ............... 365/230.03
5,959,930 * 9/1999 Sakurai .......................... 365/230.03

* cited by examiner

Primary Examiner—Richard Elms
Assistant Examiner—Anh Phung
(74) Attorney, Agent, or Firm—Wenderoth, Lind & Ponack, L.L.P.

(57) ABSTRACT

There is provided a nonvolatile semiconductor memory which is capable of operating stably and performing high-speed access operation. A timing generation means 51 for generating timing signals which make a memory core unit 4 perform access operation uses first and second clocks of the same cycle and different phases. The timing generation means 51 generates timing signals for at least one first-half event among a plurality of read access events, according to the first clock, the phase of which precedes a phases of the second clock, and generates timing signals used for processing the remaining events, according to the second clock.

12 Claims, 23 Drawing Sheets

NONVOLATILE SEMICONDUCTOR MEMORY

FIELD OF THE INVENTION

The present invention relates to a stably operable nonvolatile semiconductor memory and a high-speed accessible nonvolatile semiconductor memory.

BACKGROUND OF THE INVENTION

FIG. 20 is a schematic diagram illustrating a conventional flash EEPROM (Electrically Erasable Programmable Read-only Memory) which is a nonvolatile semiconductor.

With reference to FIG. 20, 1011~10mn denote MOS type memory cells each having a floating gate, and these memory cells are arranged in matrix. Sources of these memory cells are connected to Vs while drains thereof are connected to sources of N channel transistors 111~11n which are column gates. Control gates of the memory cells and gates of the N channel transistors (column gates) are connected to an address decoding means 2. Further, drains of the column gates are connected to a current detection means 3. Hereinafter, a memory composed of the above-described components is called a memory core unit 4. Further, a timing generation means 50 is connected to the memory core unit 4. The timing generation means 50 receives a clock and generates timing signals used for access to the memory core unit 4. The timing signals generated in the timing generation means 50 are input to the address decoding means 2 and the current detection means 3. Further, addresses are input to the address decoding means 2.

In the flash EEPROM so constructed, readout of data is performed as follows. When an address is input to the address decoding means 2, the addresss decoding means 2 selects a memory cell according to the address, and the current detection means 3 detects a current which flows in the selected memory cell and outputs the result of the detection. A description is now given of timing signals which are output from the timing generation means 50 during the data readout operation, with reference to FIG. 22. Generally, a flash EEPROM is controlled by four internal signals, NCE (chip enable signal), SAE (sense amplifier enable signal), PRC (precharge signal), and DLE (data latch signal). Further, "clock" is a signal indicating an operating point, and "Dout" is data output from the output port. All the internal signals are generated according to rising of the clock. Read access is made in a LOW period of the NCE, and it is reset in a HIGH period of the NCE. In a HIGH period of the PRC, an event of precharging a word line and a bit line is performed. In this period, a word line and a bit line are selected by the address decoding means 2 and the current detection means 3. In a period when the SAE is HIGH and the PRC is LOW, the sense amplifier (the current detection means 3) performs an event of detecting a current flowing in the selected memory cell. In a LOW period of the DLE, an event of outputting the output data from the current detection means 3 directly to the output port is performed. In a HIGH period of the DLE, an event of latching the output data to hold it until the DLE becomes LOW is performed. By the internal operation comprising the plural events mentioned above, the data Dout (i.e., the result of readout) is sequentially output from the output port.

In recent years, high-speed semiconductor integrated circuits and systems using these ICs have been developed. Amongst these ICs and systems, especially microcomputers have made rapid progress in performance, and this progress has created a demand for higher-speed access of main storage memories which are generally low in access speed, such as mask ROMs and flash memory EEPROMs. In order to meet this demand, an interleaving method is adopted, in which a main storage memory is divided into a plurality of bank memories, and addressing is performed between the respective bank memories in the horizontal direction, whereby the speed of access to consecutive addresses is apparently increased. FIG. 21 is a block diagram illustrating a conventional nonvolatile semiconductor memory performing interleaving, in which a main storage memory is divided into two bank memories. With reference to FIG. 21, two independently operable memory core units, i.e., a first bank memory 41 and a second bank memory 42, are arranged in parallel. The first bank memory 41 is a storage area for even addresses, and the second bank memory 42 is a storage area for odd addresses. Further, a timing generation means 50 generates timing signals for access to each bank memory, in accordance with a clock and a bank address for selecting a bank memory. Each bank memory receives the addresses and the timing signals.

When the clock and the address are input to the nonvolatile semiconductor memory so constructed, the memory operates as shown in a timing chart of FIG. 23. In FIG. 23, "first bank memory access" and "second bank memory access" indicate which addresses are accessed by the respective bank memories. Further, "first bank memory output" and "second bank memory output" indicate the outputs from the respective bank memories. Hereinafter, the operation of the nonvolatile semiconductor memory will be described with reference to FIGS. 21 and 23. Since interleaving is performed, consecutive addresses are sequentially input. Further, since access is started in synchronization with rising of the clock and the first and second bank memories operate alternately, data is output in each cycle of the clock. Actually, each bank memory makes access in two clock cycles. That is, by avoiding contention of access to the same bank memory, in response to a request for access to the consecutive addresses, data is output in a cycle half as long as the operation cycle (two clock cycles) of each bank memory. That is, as shown in FIG. 23, the first and second bank memories operate alternately, and data is output in each clock cycle.

In the conventional nonvolatile semiconductor memory, as shown by dotted-line arrows in FIG. 22, the internal timing signals are generated in synchronization with rising of the clock. Assuming that the clock cycle is 100 ns and the LOW period of the NCE is 80 ns, rising of the NCE is generated according to a signal which is 80 ns delayed from the rising of the clock. However, if a delay circuit is constituted by an RC or the like, the delay period varies due to variations of elements. When the delay period is reduced, the internal operation is not performed in time because of reduction in the sense period or the like, and the memory does not operate normally. On the other hand, when the delay period is increased, part of the delay period is included in the next access cycle and, also in this case, the memory does not operate normally. In either case, the operation period is not stable, whereby the memory does not operate normally.

Further, the conventional nonvolatile semiconductor memory employs the above-described interleaving method for high-speed operation. So, as shown in FIG. 23, when performing access to consecutive addresses, data is output in each clock cycle in the whole memory. However, if the access to consecutive addresses is interrupted due to a jump or the like during the interleaving operation, an access penalty occurs. To be specific, when a jump to address A11 occurs according to the result of output data D0 from address A0 (i.e., when a jump from the first bank memory 41 to the second bank memory 42 occurs), a penalty equivalent to two clock cycles occurs from when data D0 of address A0 (origin address) is output until data D11 of address A11 (destination address) is output. When a jump from address A12 to address A20 occurs (i.e., when a jump occurs in the same bank memory), a penalty equivalent to three clock cycles occurs from when data D12 of address A12 is output until data D20 of address A20 is output, because the first bank memory 41 and the second bank memory 42 operate alternately. That is, when a jump occurs in a microcomputer, the access penalty varies according to the origin address and the destination address. Moreover, when the jump occurs in the same bank memory, a penalty as long as three clock cycles occurs.

SUMMARY OF THE INVENTION

The present invention is directed to provide a nonvolatile semiconductor memory which can operate stably and a nonvolatile semiconductor memory which can perform high-speed access.

Other objects and advantages of the invention will become apparent from the detail description that follows. The detailed description and specific embodiments described are provided only for illustration since various additions and modifications within the scope of the invention will be apparent to those of skill in the art from the detailed description.

According to a first aspect of the present invention, a nonvolatile semiconductor memory comprises: a memory core unit comprising a memory cell array in which memory cells are arranged in matrix in row and column directions, address decoding means for selecting a memory cell according to an address in the row direction and an address in the column direction, and current detection means for detecting a current flowing in the memory cell selected by the address decoding means; and timing generation means for generating timing signals which make the memory core unit perform access operation, according to first and second clocks of the same cycle and different phases, wherein the timing generation means generates timing signals used for processing at least one first-half event among a plurality of read access events, according to the first clock, the phase of which precedes a phase of the second clock. Therefore, variations of delay due to variations of elements can be suppressed, and thereby the nonvolatile semiconductor memory which operates stably according to higher-precision timing signals can be realized.

According to a second aspect of the present invention, a nonvolatile semiconductor memory comprises: a memory core unit comprising a memory cell array in which memory cells are arranged in matrix in row and column directions, address decoding means for selecting a memory cell according to an address in the row direction and an address in the column direction, and current detection means for detecting a current flowing in the memory cell selected by the address decoding means; and timing generation means for generating timing signals which make the memory core unit perform access operation, according to a plurality of clocks of the same cycle and different phases, wherein the timing generation means generates timing signals used for processing at least one first-half event among a plurality of read access events, according to a clock, the phase of which precedes phases of the other clocks among the plurality of clocks, and generates timing signals used for processing the remaining events, according to clocks other than the clock for the at least one first-half event among the plurality of clocks. Therefore, variations of delay due to variations of elements can be suppressed, and thereby the nonvolatile semiconductor memory which operates stably according to higher-precision timing signals can be realized.

According to a third aspect of the present invention, a nonvolatile semiconductor memory comprises: a memory core unit comprising a memory cell array in which memory cells are arranged in matrix in row and column directions, address decoding means for selecting a memory cell according to an address in the row direction and an address in the column direction, and current detection means for detecting a current flowing in the memory cell selected by the address decoding means; and timing generation means for generating timing signals which make the memory core unit perform access operation, according to a single-phase clock, wherein the timing generation means generates timing signals used for processing at least one first-half event among a plurality of read access events, according to a first edge corresponding to either a rising edge or a falling edge of one pulse of the single-phase clock, and generates timing signals used for processing the remaining events, according to a second edge corresponding to the other edge of one pulse of the single-phase clock. Therefore, variations of delay due to variations of elements can be suppressed, and thereby the nonvolatile semiconductor memory which operates stably according to higher-precision timing signals can be realized.

According to a fourth aspect of the present invention, in the nonvolatile semiconductor memory of the second aspect, the timing generation means generates timing signals used for processing at least one first-half event among the plurality of read access events, according to a first edge corresponding to either a rising edge or a falling edge of one pulse of at least one clock among the plurality of clocks, and generates timing signals used for processing the remaining events, according to a second edge corresponding to the other edge of one pulse of the clock. Therefore, variations of delay due to variations of elements can be suppressed without increasing the number of reference clocks, and thereby the nonvolatile semiconductor memory which operates stably according to higher-precision timing signals can be realized.

According to a fifth aspect of the present invention, in the nonvolatile semiconductor memory of the first to fourth aspects, the memory core unit is divided into a plurality of bank memories, wherein each of the plurality of bank memories comprises a memory cell array in which memory cells are arranged in matrix in row and column directions, address decoding means for selecting a memory cell according to an address in the row direction and an address in the column direction, and current detection means for detecting a current flowing in the memory cell selected by the address decoding means, and is given addresses such that the plurality of bank memories sequentially perform access operation when consecutive addresses are input to the memory cells of the plurality of bank memories, and wherein the timing generation means receives a bank address for selecting one of the bank memories as an input, and generates timing signals which make the plurality of bank memories sequentially perform interleaving operation. Therefore, high-speed operation of the memory can be realized by interleaving operation, and, simultaneously, variations of delay due to variations of elements can be suppressed, whereby the nonvolatile semiconductor memory which operates stably according to higher-precision timing signals can be realized.

According to a sixth aspect of the present invention, a nonvolatile semiconductor memory comprising a first bank memory to which even addresses are assigned and a second bank memory to which odd addresses are assigned, the first and second bank memories each comprising a memory cell array in which memory cells are arranged in matrix in row and column directions, address decoding means for selecting a memory cell according to an address in the row direction and an address in the column direction, and current detection means for detecting a current flowing in the memory cell selected by the address decoding means, and timing generation means for generating timing signals which make the first and second bank memories alternately perform interleaving operation, wherein the timing generation means generates timing signals used for resetting access operation of the first bank memory when addresses of the first bank memory are sequentially input, and generates timing signals used for resetting access operation of the second bank memory when addresses of the second bank memory are sequentially input. Therefore, penalty due to a jump process in the same bank memory, which penalty is equivalent to three clock cycles in the conventional memory, can be reduced to 2 clock cycles. As a result, a higher-speed access operation in a random access memory such as a main storage memory of a microcomputer, can be realized.

According to a seventh aspect of the present invention, in the nonvolatile semiconductor memory of the sixth aspect, the timing generation means comprises an address comparator which receives a reference clock and a bank address for selecting one of the first and second bank memories as inputs, compares a bank address in a current cycle and a bank address in a cycle just before the current cycle using a cycle of the reference clock as the current cycle, outputs a first identity signal when detecting that the bank addresses in the current cycle and in the cycle just before the cycle are addresses of the first bank memory, and outputs a second identity signal when detecting that the bank addresses in the current cycle and in the cycle just before the cycle are addresses of the second bank memory; a selector which receives the reference clock and the bank address as inputs, and generates a clock by the use of the reference clock for either the first bank memory or the second bank memory which is specified by the bank address; a first delay circuit which receives a clock for the first bank memory output from the selector as an input, and delays the input clock to generate at least one delayed signal, the first delay circuit having at least one output port for outputting the delayed signal; a second delay circuit which receives a clock for the second bank memory output from the selector as an input, and delays the input clock to generate at least one delayed signal, the second delay circuit having at least one output port for outputting the delayed signal; a first pulse generator which receives the output of the first delay circuit and the first identity signal as inputs, generates timing signals used for accessing the first bank memory according to the output of first delay circuit, and generates timing signals used for resetting access operation of the first bank memory when receiving the first identity signal as an input; and a second pulse generator which receives the output of the second delay circuit and the second identity signal as inputs, generates timing signals used for accessing the second bank memory according to the output of the second delay circuit, and generates timing signals used for resetting access operation of the second bank memory when receiving the second identity signal as an input. Therefore, penalty due to a jump process in the same bank memory, which penalty is equivalent to three clock cycles in the conventional memory, can be reduced to 2 clock cycles. As a result, a higher-speed access operation in a random access memory such as a main storage memory of a microcomputer, can be realized. Moreover, the pulse of the delay circuit is cancelled according to the identity signal. Thereby, unnecessary data through and malfunction can be avoided.

According to an eighth aspect of the present invention, in the nonvolatile semiconductor memory of the sixth aspect, the timing generation means comprises an address comparator which receives a reference clock and a bank address for selecting one of the first and second bank memories, as inputs, compares a bank address in a current cycle and a bank address in a cycle just before the current cycle using a cycle of the reference clock as the current cycle, outputs a first identity signal when detecting that the bank addresses in the current cycle and in the cycle just before the current cycle are addresses of the first bank memory, and outputs a second identity signal when detecting that the bank addresses in the current cycle and in the cycle just before the current cycle are addresses of the second bank memory; a selector which receives the reference clock and the bank address as inputs, and generates a clock by the use of the reference clock for either the first bank memory or the second bank memory which is specified by the bank address; a first delay circuit which receives a clock for the first bank memory output from the selector as an input, and delays the input clock to generate at least one delayed signal, the first delay circuit having at least one output port for outputting the delayed signal; a second delay circuit which receives a clock for the second bank memory output from the selector as an input, and delays the input clock to generate at least one delayed signal, the second delay circuit having at least one output port for outputting the delayed signal; a first pulse generator which receives the output of first delay circuit, the output of the second delay circuit, and the first identity signal as inputs, generates timing signals used for accessing the first bank memory according to the outputs of the first and second delay circuits, and generates timing signals used for resetting access operation of the first bank memory when receiving the first identity signal as an input; and a second pulse generator which receives the output of the second delay circuit, the output of the first delay circuit, and the second identity signal as inputs, generates timing signals used for accessing the second bank memory according to the outputs of the first and second delay circuits, and generates timing signals used for resetting access operation of the second bank memory when receiving the second identity signal as an input. Therefore, penalty due to a jump process in the same bank memory, which penalty is equivalent to three clock cycles in the conventional memory, can be reduced to 2 clock cycles. As a result, a higher-speed access operation in a random access memory such as a main storage meory of a microcomputer, can be realized. Further, since access timing signals may be generated by using a clock for the other bank memory and its delay, each of the bank memories operates according to higher-precision signals in which variation of the absolute value of delay time can be suppressed, and timing signals generated using the clock for the other bank and its delay signal are appropriately selected, whereby unnecessary data through and malfunction can be avoided.

According to a ninth aspect of the present invention, a nonvolatile semiconductor memory comprising a first bank memory to which even addresses are assigned and a second bank memory to which odd addresses are assigned, the first and second bank memories each comprising a memory cell array in which memory cells are arranged in matrix in row and column directions, address decoding means for selecting a memory cell according to an address in the row direction and an address in the column direction, and current detection means for detecting a current flowing in the memory cell selected by the address decoding means, and timing generation means for generating timing signals which make the first and second bank memories alternately perform interleaving operation, wherein a first event of read access events of each of the first and second bank memories is reset of access operation. Therefore, penalty due to a jump process in the same bank memory, which penalty is equivalent to three clock cycles in the conventional memory, can be reduced to 2 clock cycles. Thereby, a higher-speed access operation in a random access memory such as a main storage memory of a microcomputer, can be realized. Moreover, since the first event of access operation is alway reset operation, signals used for compulsorily resetting access need not be generated, whereby a simple structure of the device can be realized.

According to a tenth aspect of the present invention, a nonvolatile semiconductor memory comprising a first bank memory to which even addresses are assigned and a second bank memory to which odd addresses are assigned, the first and second bank memories each comprising a memory cell array in which memory cells are arranged in matrix in row and column directions, address decoding means for selecting a memory cell according to an address in the row direction and an address in the column direction, and current detection means for detecting a current flowing in the memory cell selected by the address decoding means, and timing generation means which receives a reference clock and a bank address as inputs, and generates timing signals which make the first and second bank memories alternately perform interleaving operation, wherein a part or all of the timing signals output from the timing generation means are set or reset according to the reference clock. Therefore, variations of delay due to variations of elements can be suppressed, and the nonvolatile semiconductor memory which operates stably according to higher-precision timing signals can be realized. In addition, delay signals to be generated for timing signals can be reduced.

DETAILED DESCRIPTION OF THE PREFERRED EMBODIMENTS

Now, a description will be given of preferred embodiments of the present invention with reference to figures.

Embodiment 1

Figure 1:
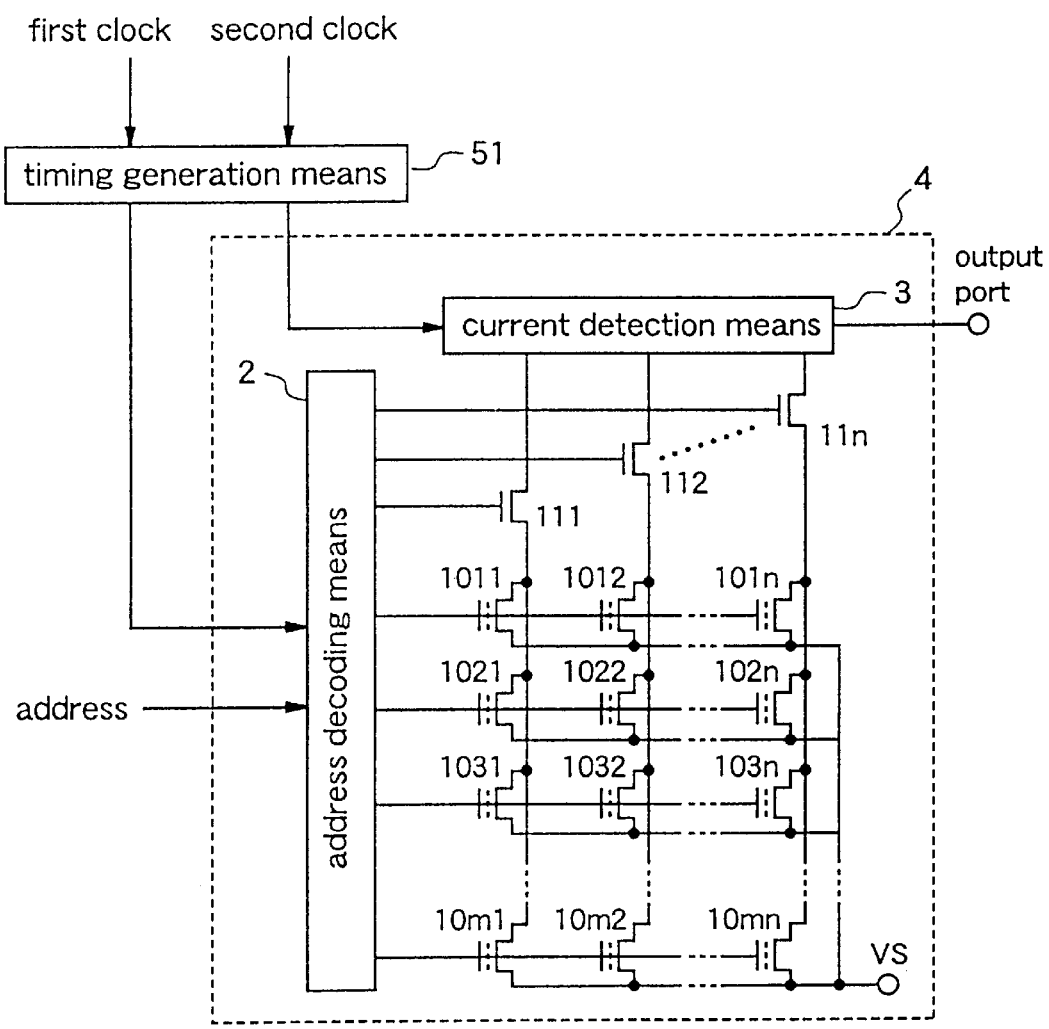
FIG. 1 is a block diagram illustrating the structure of a nonvolatile semiconductor memory according to a first embodiment of the present invention.
Figure 2:
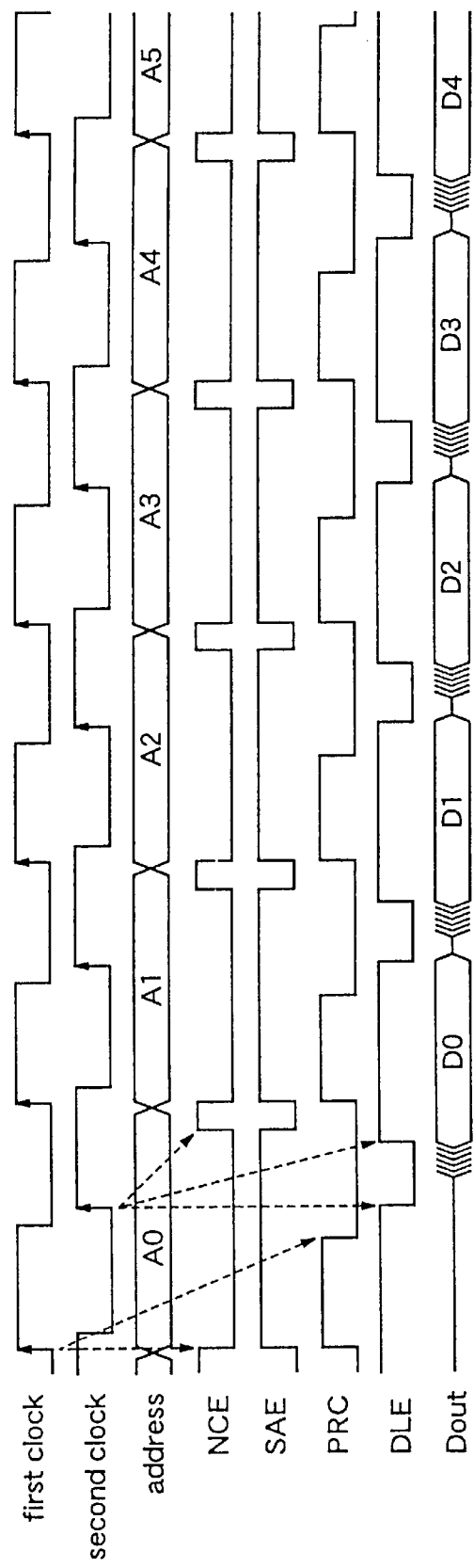
FIG. 2 is a timing chart for explaining the operation of the nonvolatile semiconductor memory according to the first embodiment.

FIG. 1 is a diagram showing a structure of a nonvolatile semiconductor memory according to a first embodiment of the present invention. FIG. 2 is a timing chart for explaining operation of the nonvolatile semiconductor memory of the first embodiment.

Figure 20:
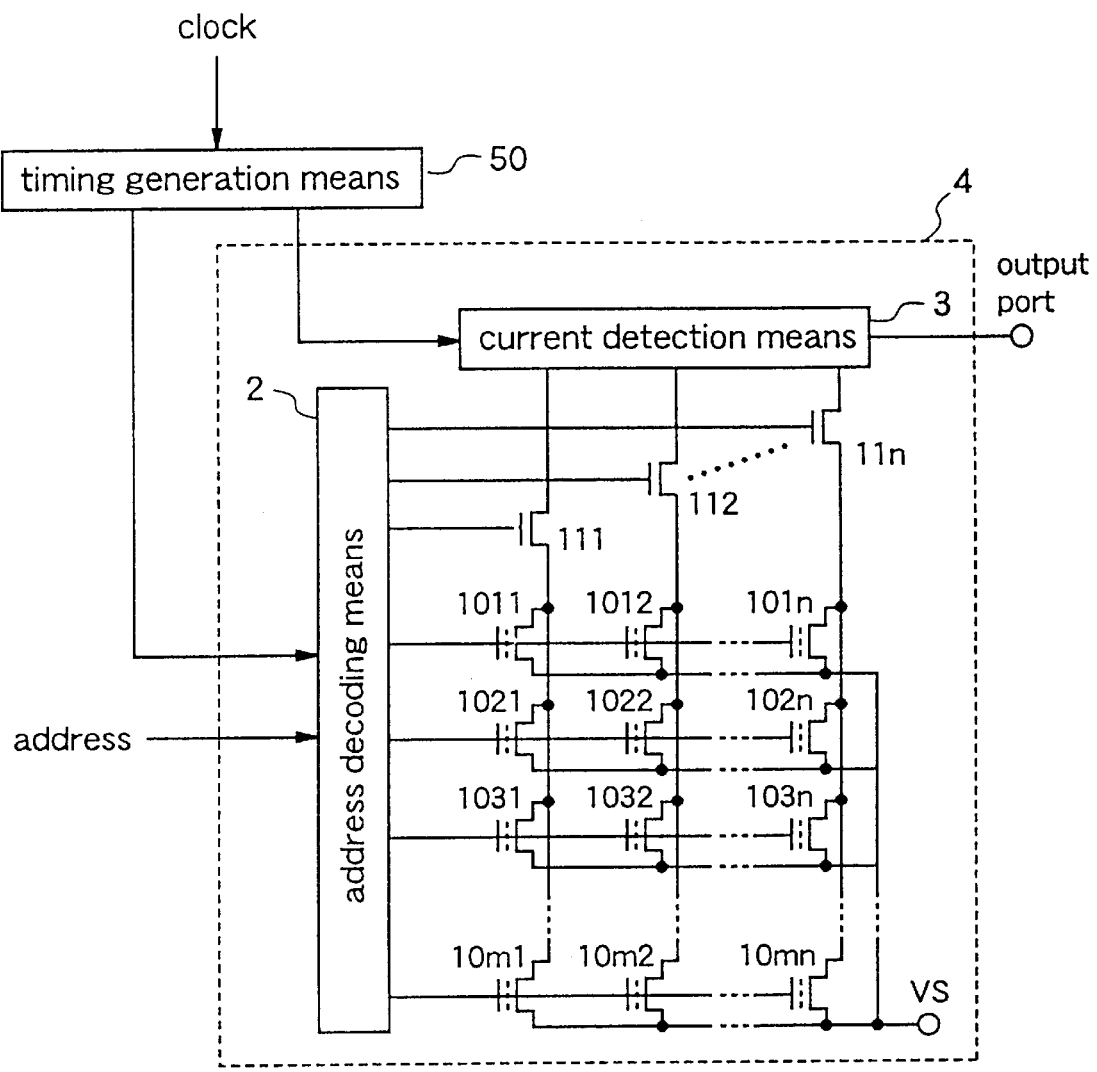
FIG. 20 is a block diagram illustrating the structure of a conventional flash EEPROM which is a nonvolatile semiconductor memory.

In FIG. 1, the same reference numerals as those shown in FIG. 20 denote the same or the corresponding parts. Reference numeral 51 denotes timing generation means which receives first and second clocks of the same cycle and different phases as inputs and generates access timing signals used for accessing the memory according to rising of these two clocks.

Operation of so constructed nonvolatile semiconductor memory will be described. Data is read as follows. An address is input to address decoding means 2, which selects a memory cell according to the address, and current detection means 3 detects a current flowing in the selected memory cell, and outputs a result. The access timing signals used for this data reading are generated by the timing generation means 51.

The nonvolatile semiconductor memory of the first embodiment operates at timings shown in FIG. 2. In FIG. 2, "NCE" is a chip enable signal, "SAE" is a sense amplifier enable signal, "PRC" is a precharge signal, "DLE" is a data latch signal, and "Dout" is data output. The difference between the nonvolatile semiconductor memory of the first embodiment and the conventional nonvolatile semiconductor memory shown in FIG. 20 is summarized as: in the conventional nonvolatile semiconductor memory, the timing generation means 50 generates all the access timing signals according to rising of a single clock, while in the nonvolatile semiconductor memory of the first embodiment, the timing generation means 51 generates the access timing signals according to rising of the first and second clocks of the same cycle and different phases.

Initially, in synchronization with rising of the first clock, the NCE becomes LOW, and the SAE and the PRC become HIGH, whereby precharge of a word line and a bit line is started. Thereafter, at timing delayed with respect to the rising of the first clock, the PRC becomes LOW, whereby precharge is completed, and then sense operation is started. Then, in synchronization with rising of the second clock, the DLE becomes LOW. Thereby, a data latch enters a THROUGH state (THROUGH), and data output of the current detection means 3 is directly output to an output port. Then, at timing delayed with respect to the rising of the second clock, the DLE becomes HIGH, whereby output data is latched. Then, at timing further delayed with respect to the rising of the second clock, the NCE becomes HIGH and the SAE becomes LOW, whereby read access is completed. In this first embodiment, the first clock, the phase of which precedes the phase of the second clock, is used to generate timing signals for the first half events (start of precharge, completion of precharge, and start of sense operation), among a plurality of events, while the second clock, the phase of which is delayed respect to the phase of the first clock, is used to generate timing signals for the remaining events.

Thus, in accordance with the nonvolatile semiconductor memory of the first embodiment, the timing generation means uses the first and second clocks of the same cycle and different phases. Of these two clocks, the first clock, the phase of which precedes the phase of the second clock, is used to generate the timing signals for at least one first-half event among the plurality of read access events, and the second clock is used to generate the timing signals for the remaining events. Therefore, variations of delay due to variations of elements can be suppressed, and the nonvolatile semiconductor memory which operates stably according to higher-precision timing of signals can be realized. For instance, assuming that there is difference of a half cycle between the first and second clocks and a clock cycle is 10 MHz, a read access period is 100 ns. In this case, delay time between the clocks is 50 ns at maximum. Hence, variations of delay due to variations of elements can be suppressed, and thereby higher-precision timing signals can be generated.

EMBODIMENT 2

Figure 3:
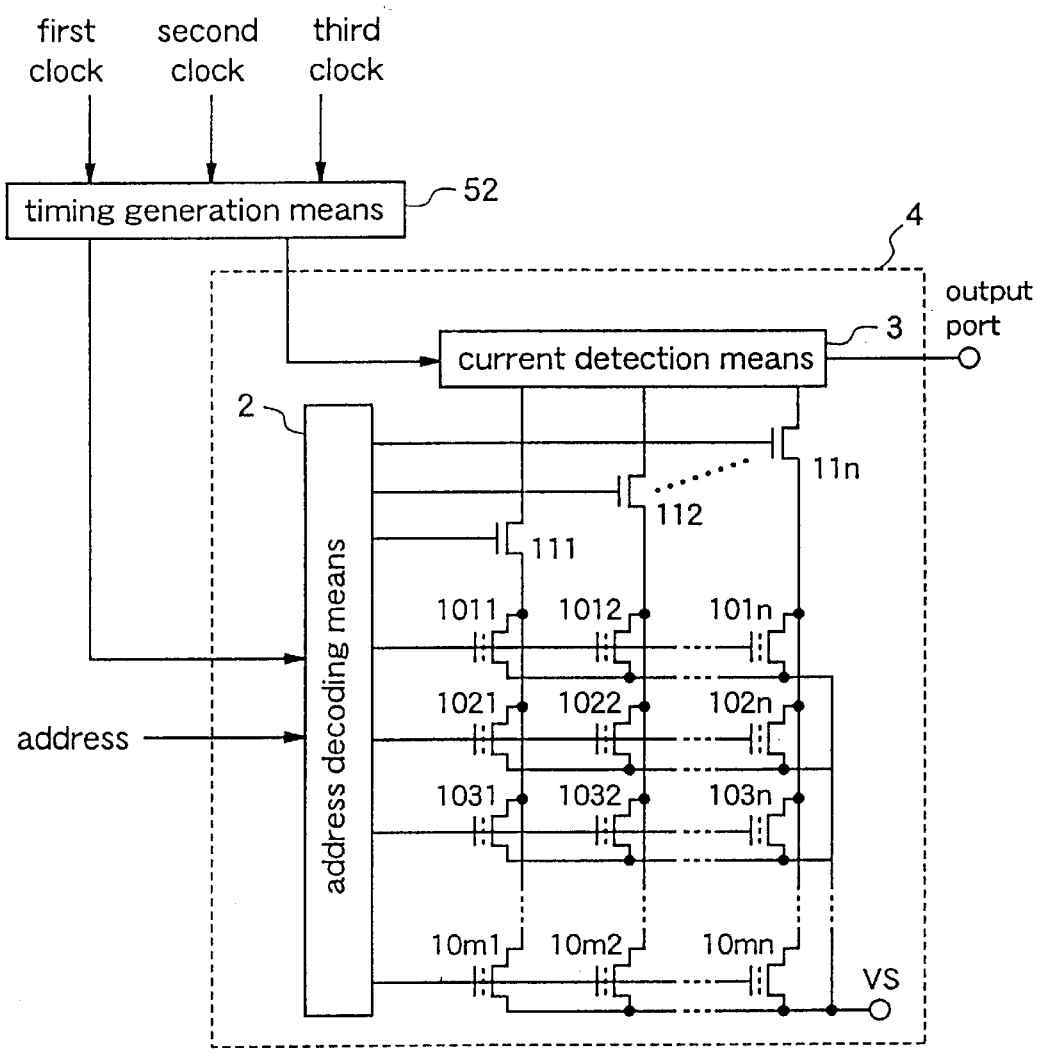
FIG. 3 is a block diagram illustrating the structure of a nonvolatile semiconductor memory according to a second embodiment of the present invention.
Figure 4:
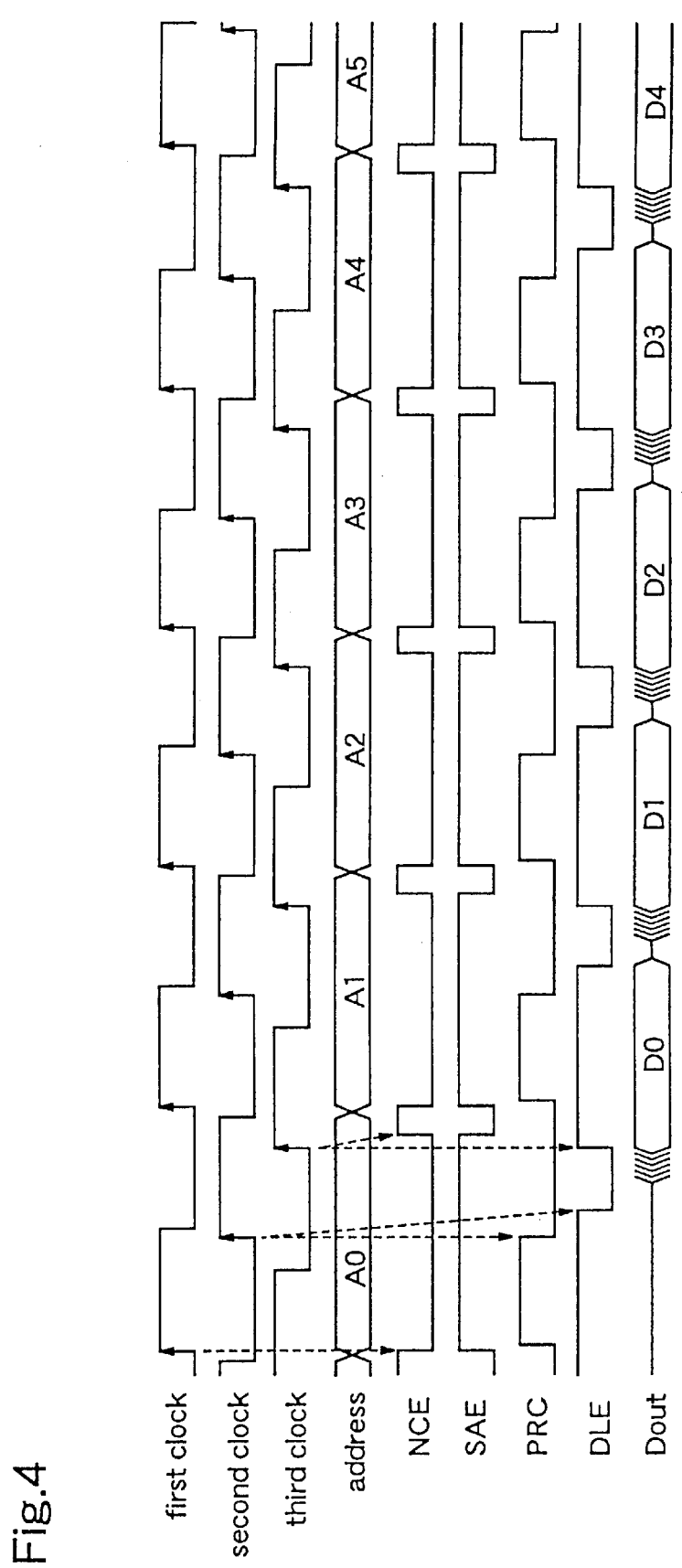
FIG. 4 is a timing chart for explaining the operation of the nonvolatile semiconductor memory according to the second embodiment.

FIG. 3 is a diagram showing a structure of a nonvolatile semiconductor memory according to a second embodiment of the present invention. FIG. 4 is a timing chart for explaining operation of the nonvolatile semiconductor memory of the second embodiment.

In FIG. 3, the same reference numerals as those shown in FIG. 1 denote the same or the corresponding parts. Reference numeral 52 denotes timing generation means which receives first, second, and third clocks of the same cycle and different phases as inputs, and generates access timing signals used for accessing the memory according to rising of these three clocks.

Figure 22:
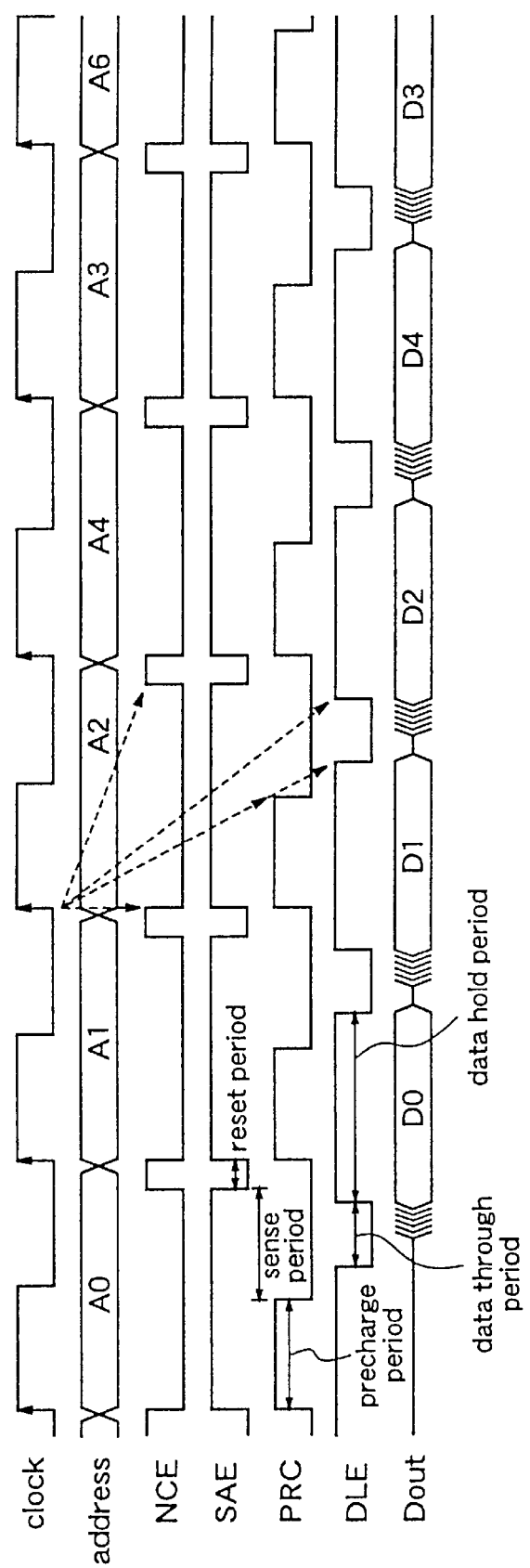
FIG. 22 is a timing chart for explaining the operation of the memory shown in FIG. 20.

In this second embodiment, the number of clocks input to the timing generation means is increased, and as shown in FIG. 3, the first to third clocks are input to the timing generation means 52. In the figure, names of signals are identical to those shown in FIGS. 2 and 22. Initially, in synchronization with rising of the first clock, the NCE becomes LOW, and the SAE and the PRC become HIGH. Thereby, precharge of the word line and the bit line is started. Then, in synchronization with rising of the second clock, the PRC becomes LOW, whereby precharge is completed and sense operation is started. Then, delay with respect to the rising of the second clock, the DLE becomes LOW. Thereby, the data latch enters THROUGH, and output data of the current detection means 3 is directly output to the output port. Then, in synchronization with rising of the third clock, the DLE becomes HIGH, whereby output data is latched. Then, delayed with respect to the rising of the third clock, the NCE becomes HIGH and the SAE becomes LOW, whereby read access is completed. In this second embodiment, the first clock, the phase of which precedes the phases of the second and third clocks, is used to generate the timing signals for the first half event (start of precharge), among a plurality of read access events, while the second and third clocks are used to generate the timing signals for the remaining events.

Thus, in accordance with the nonvolatile semiconductor memory of the second embodiment, the timing generation means uses the plurality of clocks of the same cycle and of different phases. The clock, the phase of which precedes the phases of the other clocks, is used to generate the timing signals used for processing at least one first-half event among the plurality of read access events, and the other clocks are used to generate the timing signals used for processing the remaining events. Therefore, variations of delay due to variations of elements can be suppressed, and thereby the nonvolatile semiconductor memory which operates stably according to higher-precision timing signals can be realized. For instance, assuming that a clock cycle is 100 ns, a time period between start of access and completion of precharge is 40 ns, a time period between start of access and data through is 50 ns, a time period between start of access and data latch is 80 ns, and a time period between start of access and completion of access is 90 ns, delay time of the second clock and the delay time of the third clock are respectively 10 ns. Therefore, the delay time can be thus reduced to 10 ns, and variations of delay due to variations of elements can be suppressed. Thereby, higher-precision timing signals can be generated.

EMBODIMENT 3

Figure 5:
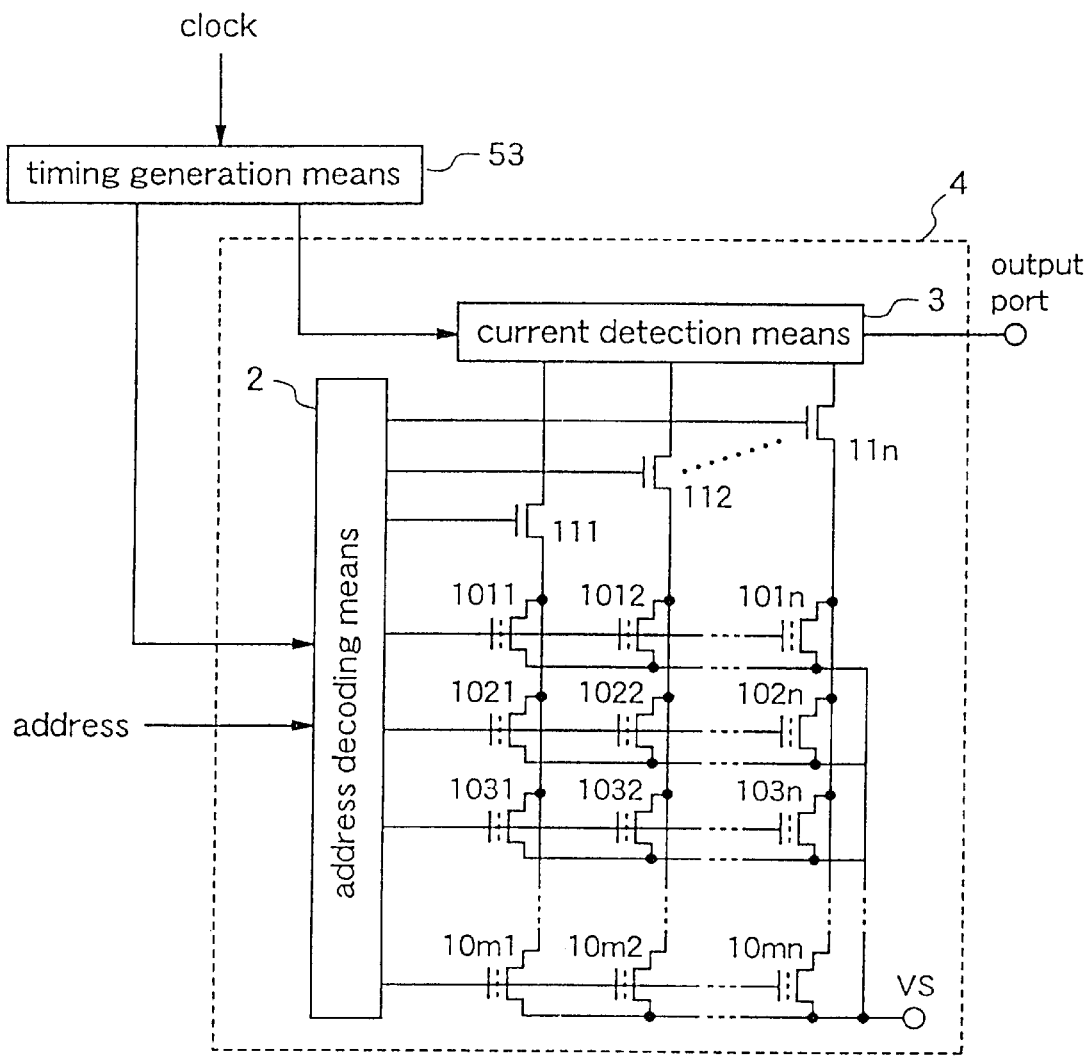
FIG. 5 is a block diagram illustrating the structure of a nonvolatile semiconductor memory according to a third embodiment of the present invention.
Figure 6:
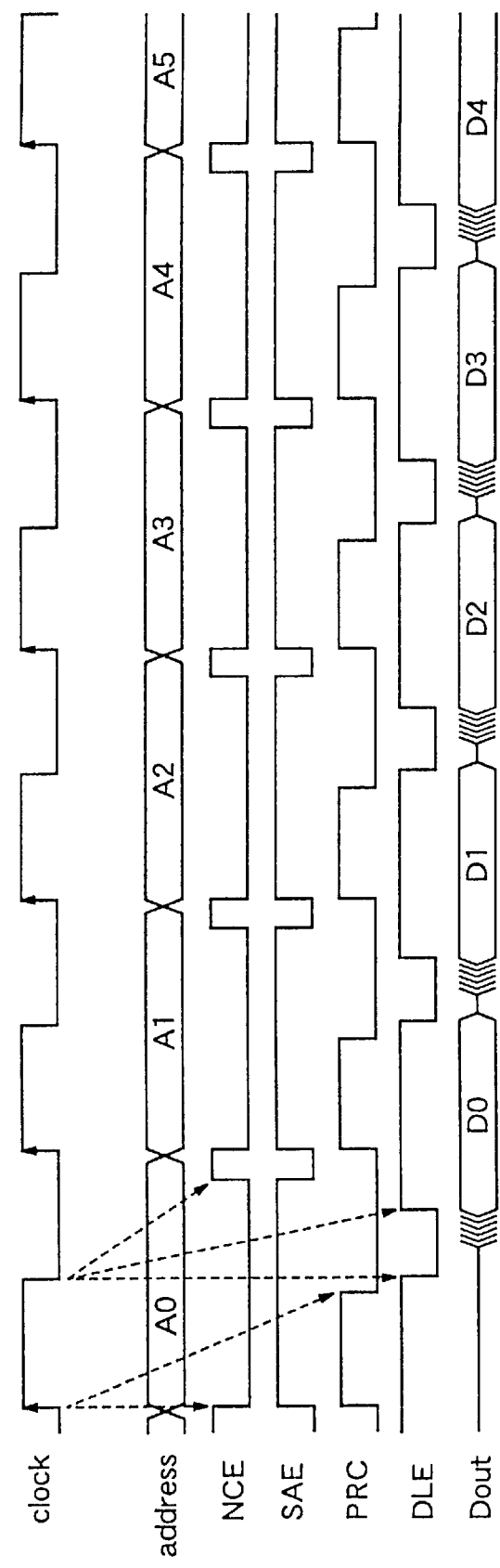
FIG. 6 is a timing chart for explaining the operation of the nonvolatile semiconductor memory according to the third embodiment.

FIG. 5 is a diagram showing a structure of a nonvolatile semiconductor memory according to a third embodiment of the present invention. FIG. 6 is a timing chart for explaining operation of the nonvolatile semiconductor memory of the third embodiment.

In FIG. 5, the same reference numerals as those shown in FIG. 1 denote the same or the corresponding parts. Reference numeral 53 denotes timing generation means which receives a clock as an input and generates access timing signals used for accessing the memory according to rising and falling of the clock.

In this third embodiment, one clock is input to the timing generation means 53, which, as shown in FIG. 6, generates timing signals according to rising and falling of the clock. Name of signals are identical to those shown in FIGS. 2, 4 and 22. Initially, in synchronization with rising of the clock, the NCE becomes LOW, and the SAE and the PRC become HIGH. Thereby, precharge of the word line and the bit line is started. Then, delayed with respect to the rising of the clock, the PRC becomes LOW, whereby precharge is completed and sense operation is started. Then, in synchronization with falling of the clock, the DLE becomes LOW. Thereby, the data latch enters THROUGH, and output data of the current detection means 3 is directly output to the output port. Then, delayed with respect to the falling of the clock, the DLE becomes HIGH, whereby output data is latched. Then, further delayed with respect to the falling of the clock, the NCE becomes HIGH and the SAE becomes LOW, whereby read access is completed. In this third embodiment, the rising edge of the clock is used to generate the timing signals for the first-half events (start of precharge, completion of precharge, and start of sense operation) among a plurality of read access events, and the falling edge of the clock is used to generate the timing signals used for processing the remaining events.

Thus, in accordance with the nonvolatile semiconductor memory of the third embodiment, the timing generation means uses a single-phase clock to generate the timing signals. The generation means uses a first edge of rising or falling of one pulse of the single-phase clock, to generate the timing signals used for processing at least one first-half event among the plurality of read access events, and uses a second edge corresponding to the other edge of the single-phase clock to generate the timing signals used for processing the remaining events. Therefore, in contrast with the conventional nonvolatile semiconductor memory which generates the timing signals using the rising edge and its delay, the absolute value of delay time can be reduced. For instance, assuming that a clock cycle is 100 ns, duty is 50, a time period between start of access and completion of precharge is 40 ns, a time period between start of access and data through is 50 ns, a time period between start of access and data latch is 80 ns, and a time period between start of access and completion of access is 90 ns, delay of rising of the clock is 40 ns and delay of falling of the clock is 40 ns. Therefore, the delay time of the clock can be thus reduced to 40 ns at maximum, and variations of delay due to variations of elements can be suppressed. Thereby, higher-precision timing signals can be generated.

EMBODIMENT 4

Figure 7:
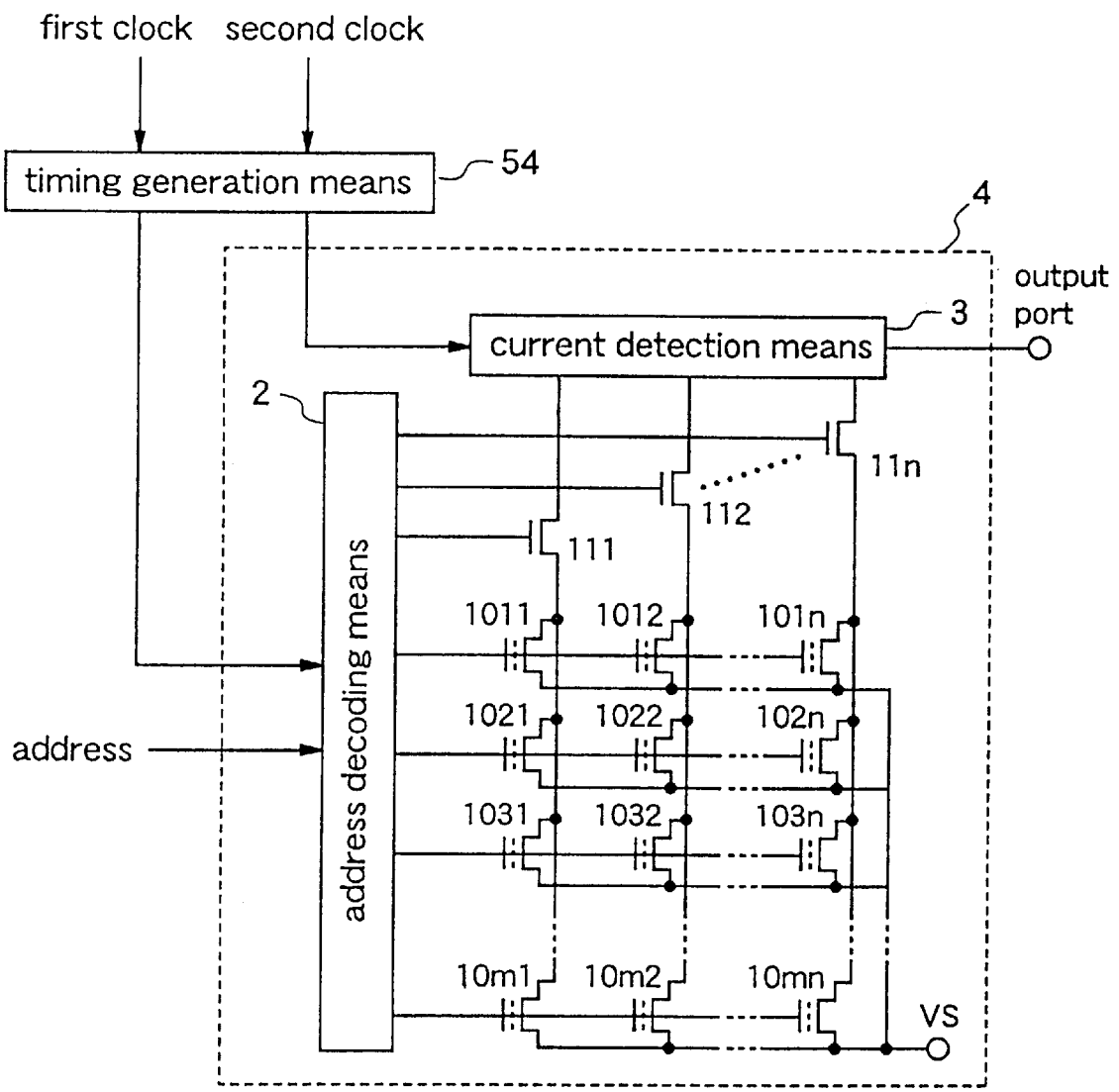
FIG. 7 is a block diagram illustrating the structure of a nonvolatile semiconductor memory according to a fourth embodiment of the present invention.
Figure 8:
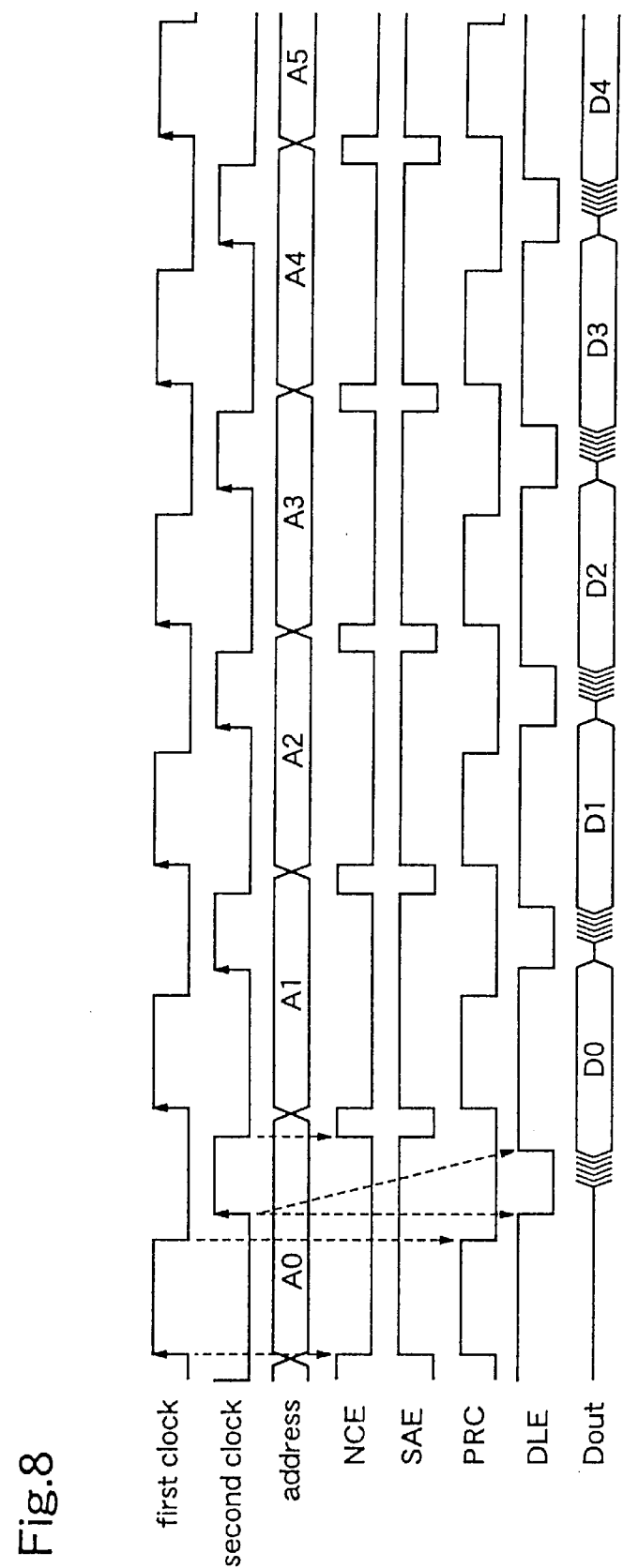
FIG. 8 is a timing chart for explaining the operation of the nonvolatile semiconductor memory according to the fourth embodiment.

FIG. 7 is a diagram showing a structure of a nonvolatile semiconductor memory according to a fourth embodiment of the present invention. FIG. 8 is a timing chart for explaining operation of the nonvolatile semiconductor memory of the fourth embodiment.

In FIG. 7, the same reference numerals as those shown in FIG. 1 denote the same or the corresponding parts. Reference numeral 54 denotes timing generation means which receives first and second clocks as inputs, and generates access timing signals used for accessing the memory according to rising and falling of these two clocks.

Operation will be described. Initially, in synchronization with rising of the first clock, the NCE becomes LOW, and the SAE and the PRC become HIGH, whereby precharge of the word line and the bit line is started. Then, at timing of falling of the first clock, the PRC becomes LOW, whereby precharge is completed and sense operation is started. Then, in synchronization with rising of the second clock, the DLE becomes LOW, whereby the data latch enters THROUGH and output data of the current detection means 3 is directly output to the output port. Then, at timing delayed with respect to the rising of the second clock, the DLE becomes HIGH, whereby output data is latched. Then, at timing of falling of the second clock, the NCE becomes HIGH and the SAE becomes LOW, whereby read access is completed.

Thus, in accordance with the fourth embodiment, precharge of the word line and the bit line is performed according to the rising edge and the falling edge of the first clock, while data latch and sense operation are performed according to the rising edge of the second clock, timing delayed with respect to the rising edge of the second clock, and the falling edge of the second clock. Therefore, variations of delay due to variations of elements can be suppressed, and thereby higher-precision timing signals can be generated. In addition, since the rising edge and the falling edge of the clocks are both used, the absolute value of delay time can be reduced without increasing the number of reference clocks.

EMBODIMENT 5

Figure 9:
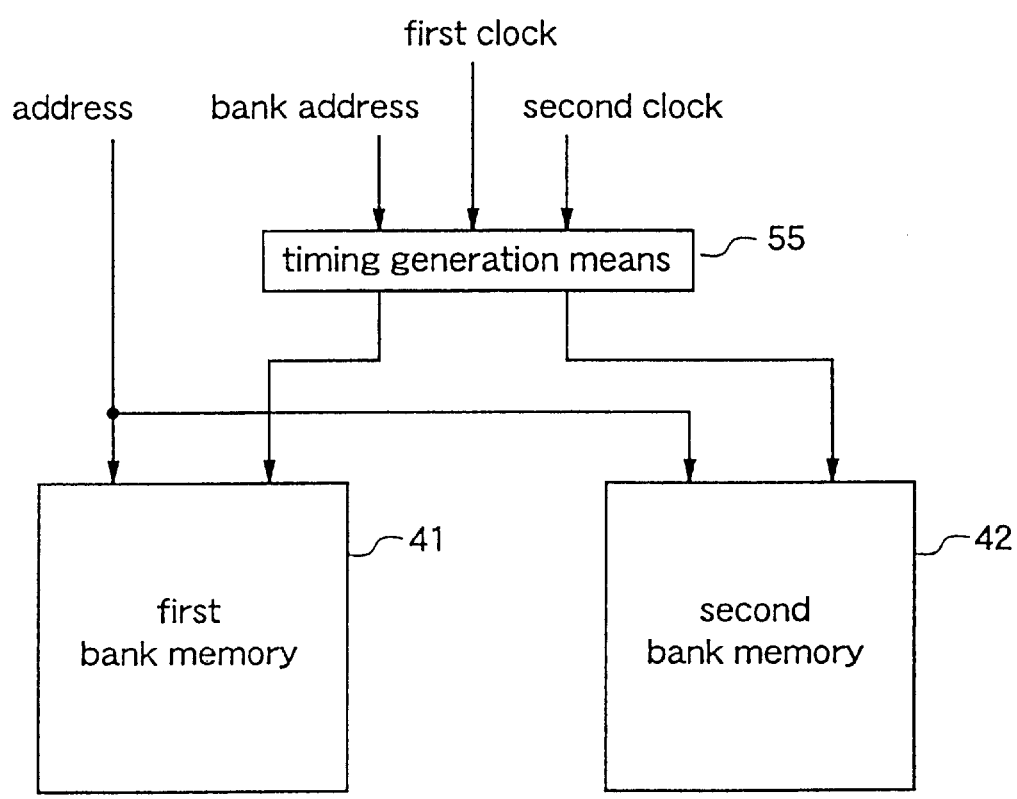
FIG. 9 is a block diagram illustrating the structure of a nonvolatile semiconductor memory according to a fifth embodiment of the present invention.
Figure 10:
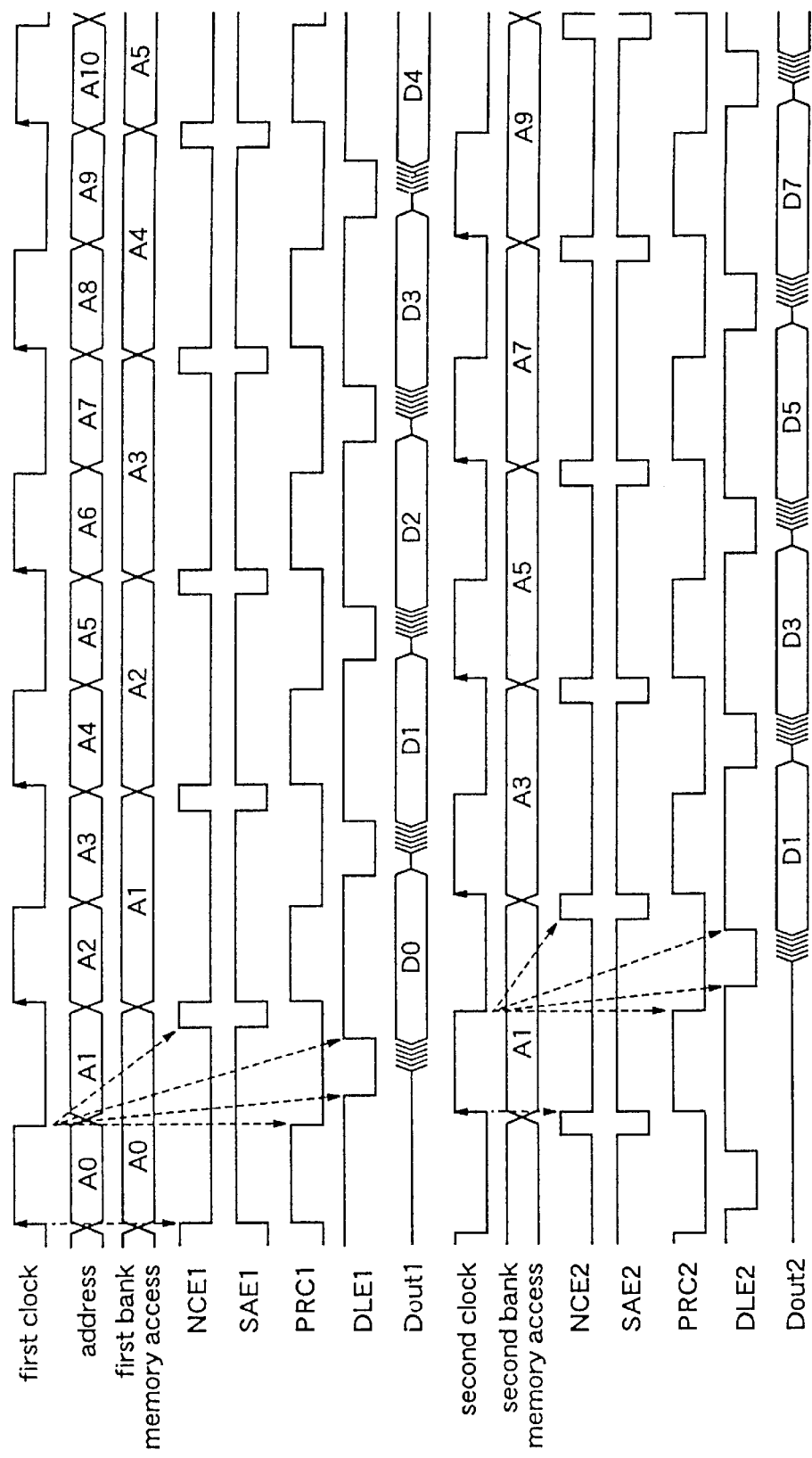
FIG. 10 is a timing chart for explaining the operation of the nonvolatile semiconductor memory according to the fifth embodiment.

FIG. 9 is a diagram showing a structure of a nonvolatile semiconductor memory according to a fifth embodiment of the present invention. FIG. 10 is a timing chart for explaining operation of the nonvolatile semiconductor memory of the fifth embodiment.

Figure 21:
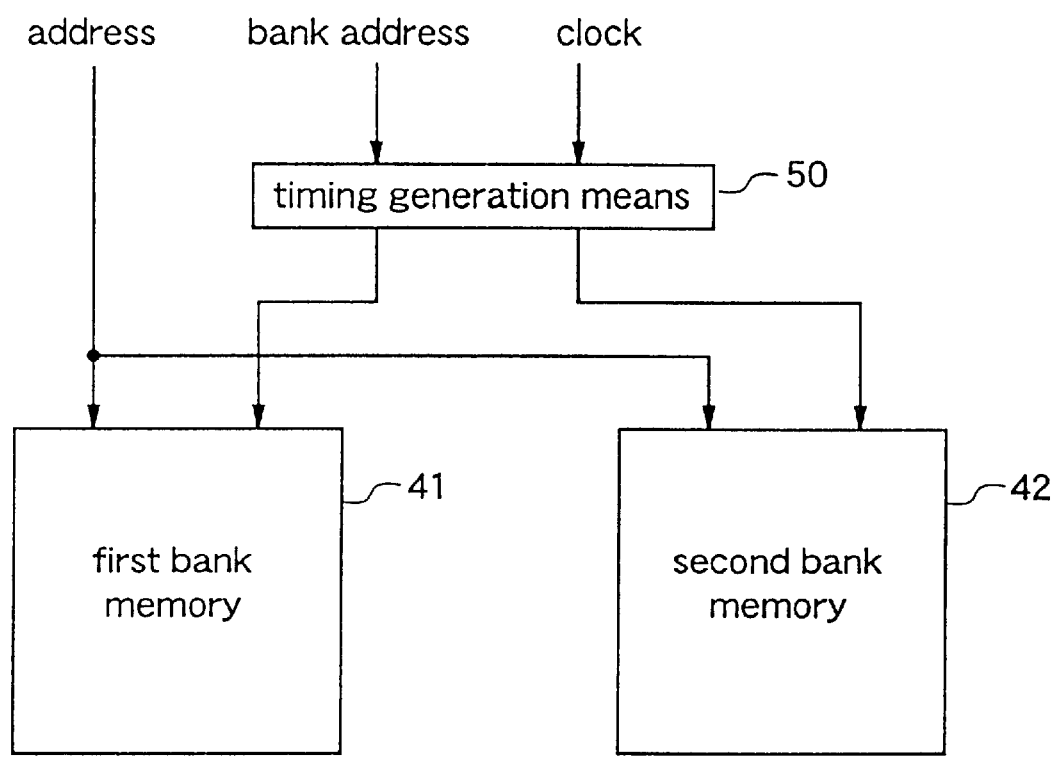
FIG. 21 is a block diagram illustrating the structure of a conventional nonvolatile semiconductor memory performing interleaving, in which a main storage memory is divided into two bank memories.

In FIG. 9, the same reference numerals as those shown in FIG. 21 denote the same or the corresponding parts. Reference numeral 55 denotes timing generation means which receives a bank address, first and second clocks of the same cycle and different phases, as inputs, and generates access timing signals used for accessing the memory according to rising of these two clocks.

In FIG. 10, "NCE1", "SAE1", "PRC1", and "DLE1" are timing signals for a first bank memory 41, "Dout1" is an output of the first band memory 41, "NCE2", "SAE2", "PRC2", and "DLE2" are timing signals for a second bank memory 42, and "Dout2" is an output of the second bank memory 42.

Operation of so constructed nonvolatile semiconductor memory will now be described. Initially, the first and second bank memories 41 and 42 are supplied with addresses. In general, consecutive addresses are sequentially input to these memories for interleaving operation. The timing generation means 55 generates timing signals which make the first and second bank memories 4a and 42 perform interleaving operation, and supplies these timing signals thereto. Turning to FIG. 10, the first and second bank memories 41 and 42 start access in synchronization with a rising edge of the first clock and a rising edge of the second clock, respectively. First, operation of the first bank memory 41 will be discussed. Initially, in synchronization with rising of the first clock, the NCE1 becomes LOW and the SAE1 and PRC1 become HIGH, whereby precharge of the word line and the bit line is started. Then, in synchronization with falling of the first clock, the PRC1 becomes LOW, whereby precharge is completed and sense operation is started. Then, at timing delayed with respect to the falling of the first clock, the DLE1 becomes LOW. Thereby, the data latch enters THROUGH, and the output data of the current detection means 3 is directly output to the output port. Then, at timing further delayed with respect to the falling of the first clock, the DLE1 becomes HIGH, whereby the output data is latched. The second bank memory 42 operates like the first bank memory at timing of rising of the second clock, falling of the second clock, and at timing delayed with respect to the falling of the second clock.

As can be seen from the FIG. 10, since the first and second bank memories 41 and 42 perform interleaving operation, they alternately operate and output data. Hence, in the entire memory, data is output in a cycle as half as access time of each bank memory. In this way, contention for access to the same bank memory is avoided, whereby in response to a request for access to the consecutive addresses, data is output in a cycle as half as an operation cycle of each bank memory.

Thus, in accordance with the fifth embodiment, in the nonvolatile semiconductor memory which performs interleaving operation, plural reference clocks are used to generate the timing signals used for access operation of the memory. Therefore, the absolute value of delay time can be reduced, and variations of delay due to variation of elements can be suppressed. Thereby, each of the bank memories operates according to higher-precision timing signals. In contrast with a case where each bank memory operates individually using interleaving, since the memory of this embodiment operates twice faster, high-speed operation of a main storage memory which relatively operates at a low speed can be realized.

While in this embodiment, using the first and second clocks, the first bank memory operates at timing of rising and falling of the first clock, and at timing delayed with respect to the falling of the first clock, and the second bank memory operates at timing of rising and falling of the second clock, and at timing delayed with respect to the falling of the second clock, each of the bank memories may operate at timing generated using plural clocks like the first and second embodiments.

In addition, while in this embodiment, the rising and falling edges of the clocks are both used to generate the timing signals, when using plural clocks, various clock inputs and their delay, for example, only one of the rising and falling of the clocks, may be used to generate the access timing signals. Also in this case, the same effects as provided by this embodiment are achieved.

Further, while this embodiment employs the first and second bank memories to which even addresses and odd addresses are assigned, respectively, three or more bank memories may be employed.

EMBODIMENT 6

Figure 11:
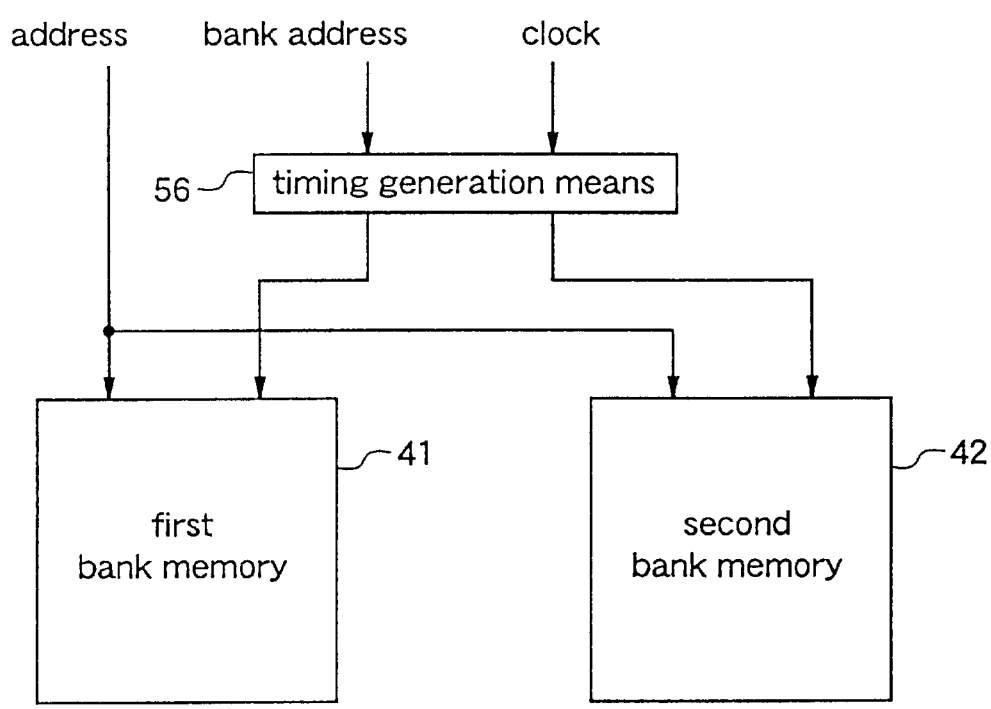
FIG. 11 is a block diagram illustrating the structure of a nonvolatile semiconductor memory according to a sixth embodiment of the present invention.

FIG. 11 is a diagram showing a structure of a nonvolatile semiconductor memory according to a sixth embodiment of the present invention.

In FIG. 11, the same reference numerals as those shown in FIG. 9 denote the same or the corresponding parts. Reference numeral 56 denotes timing generation means which receives a bank address and a reference clock as inputs, and generates access timing signals used for accessing the memories based on these.

Figure 12:
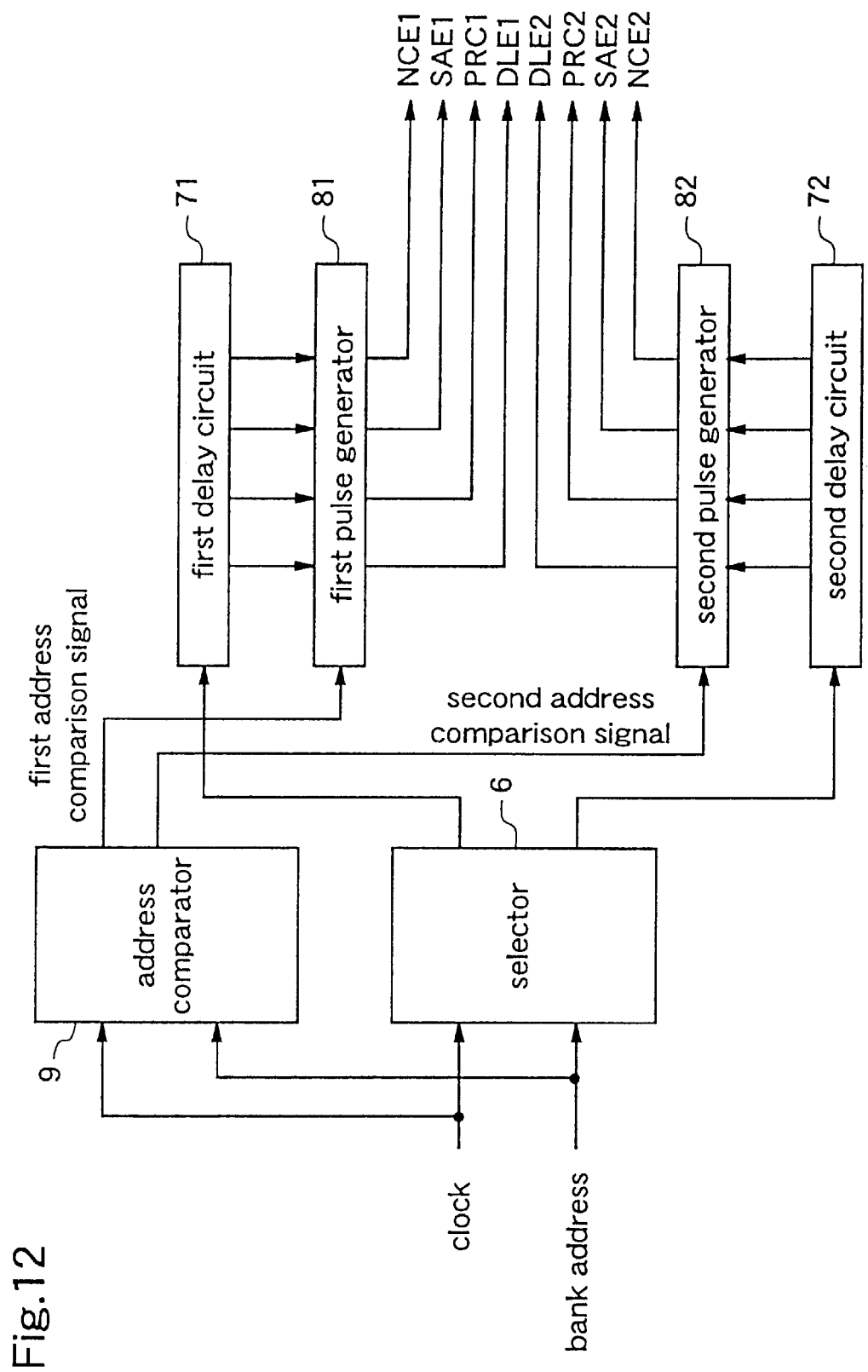
FIG. 12 is a block diagram illustrating the internal structure of a timing generation means included in the nonvolatile semiconductor memory according to the sixth embodiment.

FIG. 12 is a diagram showing an internal structure of the timing generation means 56 shown in FIG. 11. In FIG. 12, reference numeral 6 denotes a selector which receives a bank address and a clock as inputs, and generates first and second clocks. 71 denotes a first delay circuit which delays the first clock output from the selector 6 and outputs delayed signals. 72 denotes a second delay circuit which delays the second clock output from the selector 6 and outputs delayed signals. 9 denotes an address comparator which receives the clock and the bank address as inputs, compares a bank address in a current clock cycle and a bank address in a previous cycle (a cycle just before the current cycle), outputs a first identity signal as a first address comparison signal when both of them are addresses of the first bank memory 41 (memory to which even addresses are assigned), and outputs a second identity signal as a second address comparison signal when both of them are addresses of the second bank memory 42 (memory to which odd addresses are assigned). 81 denotes a first pulse generator which receives the output of the first delay circuit 71 and the first address comparison signal from the address comparator 9 as inputs, and generates timing signals (NCE1, SAE1, PRC1, DLE1) which make the first bank memory operate. 82 denotes a second pulse generator which receives the output of the second delay circuit 72 and the second address comparison signal from the address comparator 9 as inputs, and generates timing signals (NCE2, SAE2, PRC2, DLE2) which make the second bank memory operate.

Operation of so constructed nonvolatile semiconductor memory will now be described.

Figure 13:
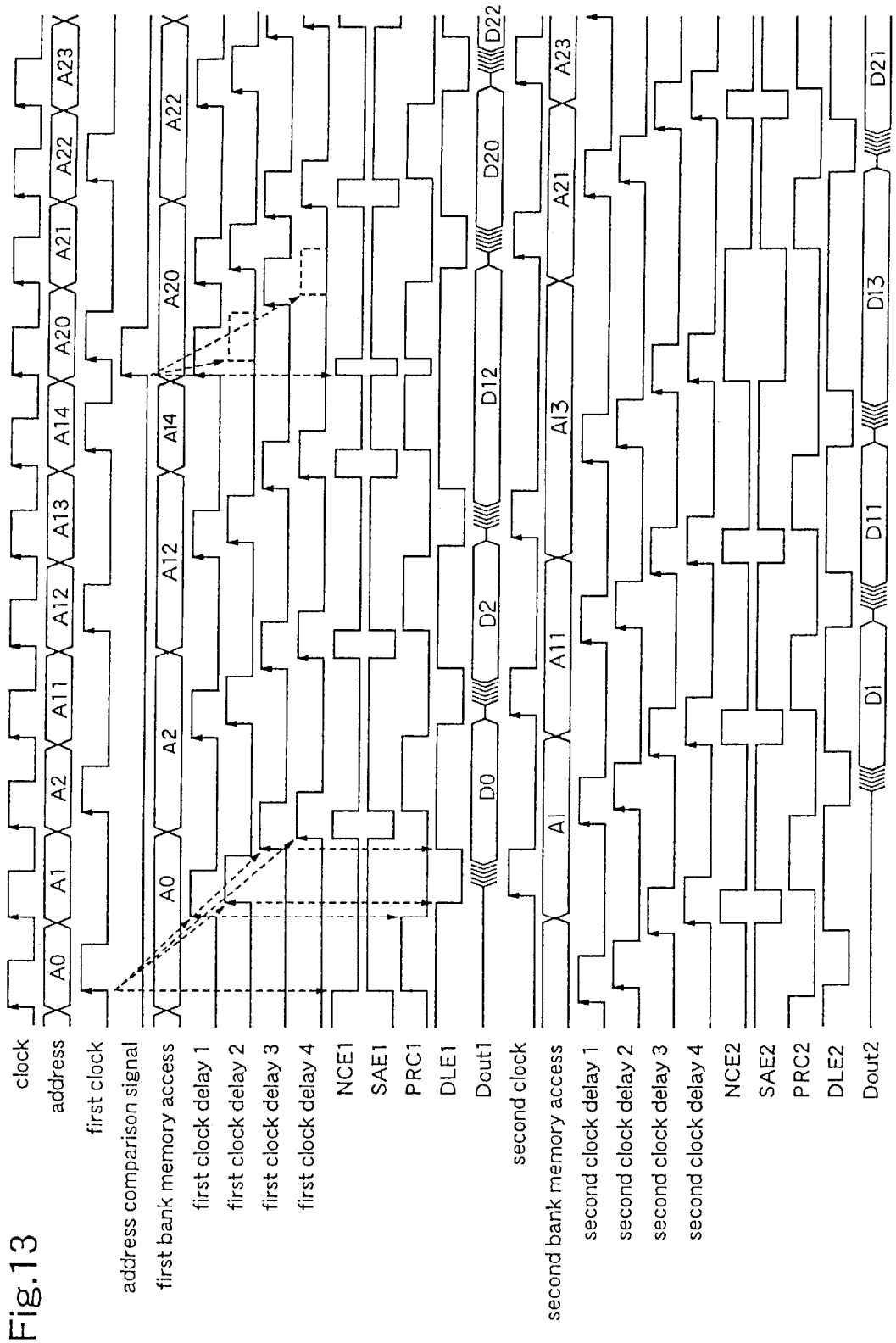
FIG. 13 is a timing chart for explaining the operation of the nonvolatile semiconductor memory according to the sixth embodiment.

FIG. 13 is a timing chart for explaining operation of the nonvolatile semiconductor memory of the sixth embodiment. In FIG. 13, a clock is a reference clock input to the timing generation means 56. The first and second clocks are output from the selector 6 and input to the first and second delay circuits 71 and 72, respectively. First clock delays 1–4 are the output of the first delay circuit and second clock delays 1–4 are the output of the second delay circuit 72. The "NCE1", "SAE1", "PRC1", and "DLE1" are timing signals for the first bank memory 41, and "Dout1" is the output of the first bank memory 41. The "NCE2", "SAE2", "PRC2" and "DLE2" are timing signals for the second bank memory 42, and "Dout2" 2 is the output of the second bank memory 42.

The first clock output from the selector 6 is input to the first delay circuit 71, which directly outputs the input first clock or outputs the first clock delays 1–4 obtained by delaying the first clock, to the first pulse generator 81. The address comparator 9 compares the bank address in the current clock cycle and the bank address in the previous cycle, and outputs the first identity signal as the first address comparison signal when both of them are addresses of the first bank memory 41 (memory to which even addresses are assigned). In other words, the address comparison signal (the first address comparison signal shown in FIG. 12) is output to the first pulse generator 81 when a jump process is performed and a jump is made in the same bank memory.

A clock (reference clock) for address A0 shown in FIG. 13 is input to the selector 6, which generates the first clock. The first delay circuit 71 generates the first clock delays 1–4 obtained by delaying the first clock. In synchronization with rising of the first clock, the NCE1 becomes LOW, and the SAE1 and the PRC1 become HIGH, whereby precharge of the word line and the bit line is started. Then, in synchronization with rising of the first clock delay 1, the PRC1 becomes LOW, whereby prechrage is completed and sense operation is started. Then, in synchronization with rising of the first clock delay 2, the DLE1 becomes LOW, whereby the data latch enters THROUGH and output data of the current detection means 3 is directly output to the output port. Then, in synchronization with rising of the first clock delay 3, the DLE1 becomes HIGH, whereby the output data is latched. Then, in synchronization with rising of the first clock delay 4, the NCE1 becomes HIGH, and the SAE1 becomes LOW, whereby access is completed.

In general, consecutive addresses are sequentially input for interleaving operation. Therefore, the selector 6 alternately outputs the first and second clocks. In normal interleaving operation, since addresses of the first and second bank memories are alternately input, the address comparison signal is not output from the address comparator 9. The respective bank memories, according to rising of the first and second clocks as triggers, alternately start access in one clock cycle, and alternately output data. Although each of the bank memories makes access in 2 clock cycles, these bank memories performs interleaving operation, and therefore, in the entire memory, data is output in each cycle.

Subsequently, a description is given of a case where access by the consecutive addresses becomes impossible due to the jump process and the like.

Figure 23:
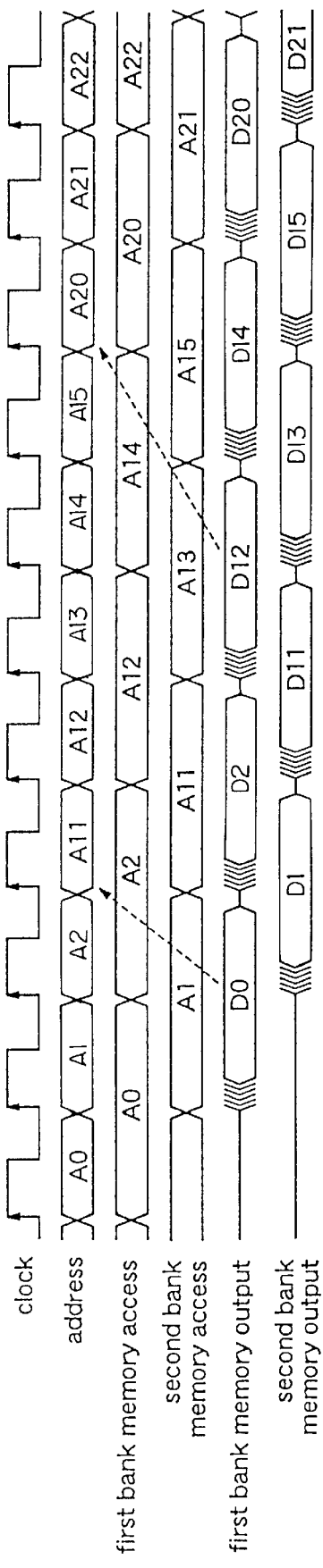
FIG. 23 is a timing chart for explaining the operation of the memory shown in FIG. 21.

When a jump between addresses in different bank memories, for example, a jump from an even address to an odd address, or a jump from an odd address to an even address, is made, since addresses sequentially input are addresses of different bank memories, the address comparison signal is not output, and access operation is performed like the normal interleaving operation. Therefore, penalty in the jump process herein is, like the prior art examples shown in FIG. 23, equivalent to 2 clock cycles.

When a jump between addresses within the same bank memory, for example, a jump from an even address to an even address, or a jump from an odd address to an odd address, is made, that is, addresses of the same bank are sequentially input, the following operation is performed. FIG. 13 shows a case where a jump is made from address A12 to address A20, and thereby addresses A14 and A20 of the first bank memory 41 are sequentially input. As shown in FIG. 13, when the addresses A14 and A20 are sequentially input, the address comparator 9 detects that the addresses of the first bank memory 41 are sequentially input, and outputs the first identity signals as the first address comparison signal. According to the address comparison signal from the address comparator 9, the first pulse generator 81 resets access by setting the NCE1 and the DLE1 at HIGH and setting the SAE1 and the PRC1 at LOW. Thereby, access operation for the address A14 is compulsorily terminated, and immediately after this, access operation for the address A20 is started. Thereby, penalty due to a jump process in the same bank memory, which penalty is equivalent to three clock cycles in the conventional memory, can be reduced to 2 clock cycles. As a result, a higher-speed access operation can be realized.

The first pulse generator 81 generates timing signals for compulsorily resetting access, according to the address comparison signal (first address comparison signal). However, when the first delay circuit 71 outputs the delay signals of the first clock for the address A14 as normal, a portion of the first clock delay 2 represented by a dotted line and a portion of the first clock delay 4 represented by a dotted line are output. If the first pulse generator 81 outputs the DLE1 set at LOW according to the portion of the first clock delay 2 represented by a dotted line, this causes unnecessary data through. In addition, if the first pulse generator 81 outputs the NCE1 set at HIGH and the SAE1 set at LOW according to the portion of the first clock delay 4 represented by a dotted line, reset takes place while access to the A20 is made, causing malfunction. To avoid this, the pulse generator 81 cancels pulses of the first clock delays 2 and 4, upon receipt of the address comparison signal (first identity signal). Thereby, unnecessary data through and malfunction can be avoided.

Thus, in accordance with the nonvolatile semiconductor memory of the sixth embodiment, when the addresses of the first bank memory are sequentially input, the timing generation means generates the timing signals for resetting access operation for the first bank memory, while when the addresses of the second bank memory are sequentially input, the generation means generates the timing signals for resetting access operation for the second bank operation. Therefore, penalty due to a jump process in the same bank memory, which penalty is equivalent to three clock cycles in the conventional memory, can be reduced to 2 clock cycles. As a result, in the random access memory such as the main storage memory in the micro computer, high-speed access is realized.

While in this embodiment, the first and second clocks are obtained from the clock input according to the bank address, the first bank memory operates at timing of rising of the first clock and timing delayed with respect to the rising of the first clock, and the second bank memory operates at timing of rising of the second clock and at timing delayed with respect to the rising of the second clock, each of the banks may operate at timing generated by the use of plural clocks like the first and second embodiment.

In addition, while in this embodiment, the rising edges of the clocks and their delay are used for timing generation, access timing signals may be generated by using various clock inputs and their delays, for example, both of the rising and falling edges may be employed with the same effects as described above.

Further, while in this embodiment two bank memories are employed, three or more bank memories may be employed.

EMBODIMENT 7

Figure 14:
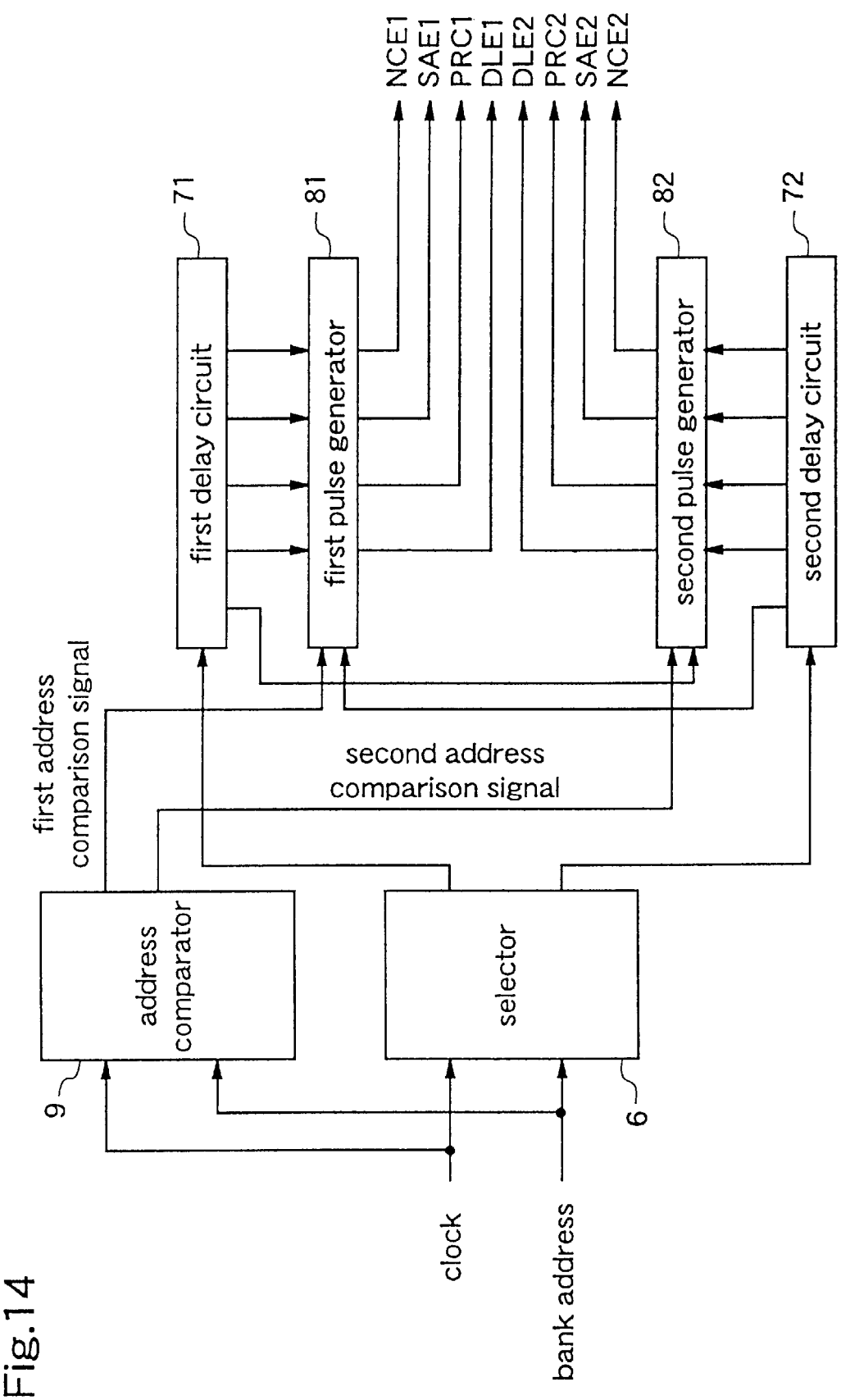
FIG. 14 is a block diagram illustrating the internal structure of a timing generation means included in a nonvolatile semiconductor memory according to a seventh embodiment of the present invention.

Hereinafter, a nonvolatile semiconductor memory according to a seventh embodiment of the invention will be described. The structure of the nonvolatile semiconductor memory according to this seventh embodiment is fundamentally identical to that of the nonvolatile semiconductor memory according to the sixth embodiment shown in FIG. 11 except the internal structure of the timing generation means 56. FIG. 14 is a block diagram illustrating the internal structure of a timing generation means included in the nonvolatile semiconductor memory of this seventh embodiment. In FIG. 14, the same reference numerals as those shown in FIG. 12 denote the same or corresponding parts. The timing generation means according to the seventh embodiment shown in FIG. 14 is different from the timing generation means according to the sixth embodiment shown in FIG. 12 in that part of the output from the second delay circuit 72 is applied to the first pulse generator 81 while part of the output from the first delay circuit 71 is applied to the second pulse generator 82.

Figure 15:
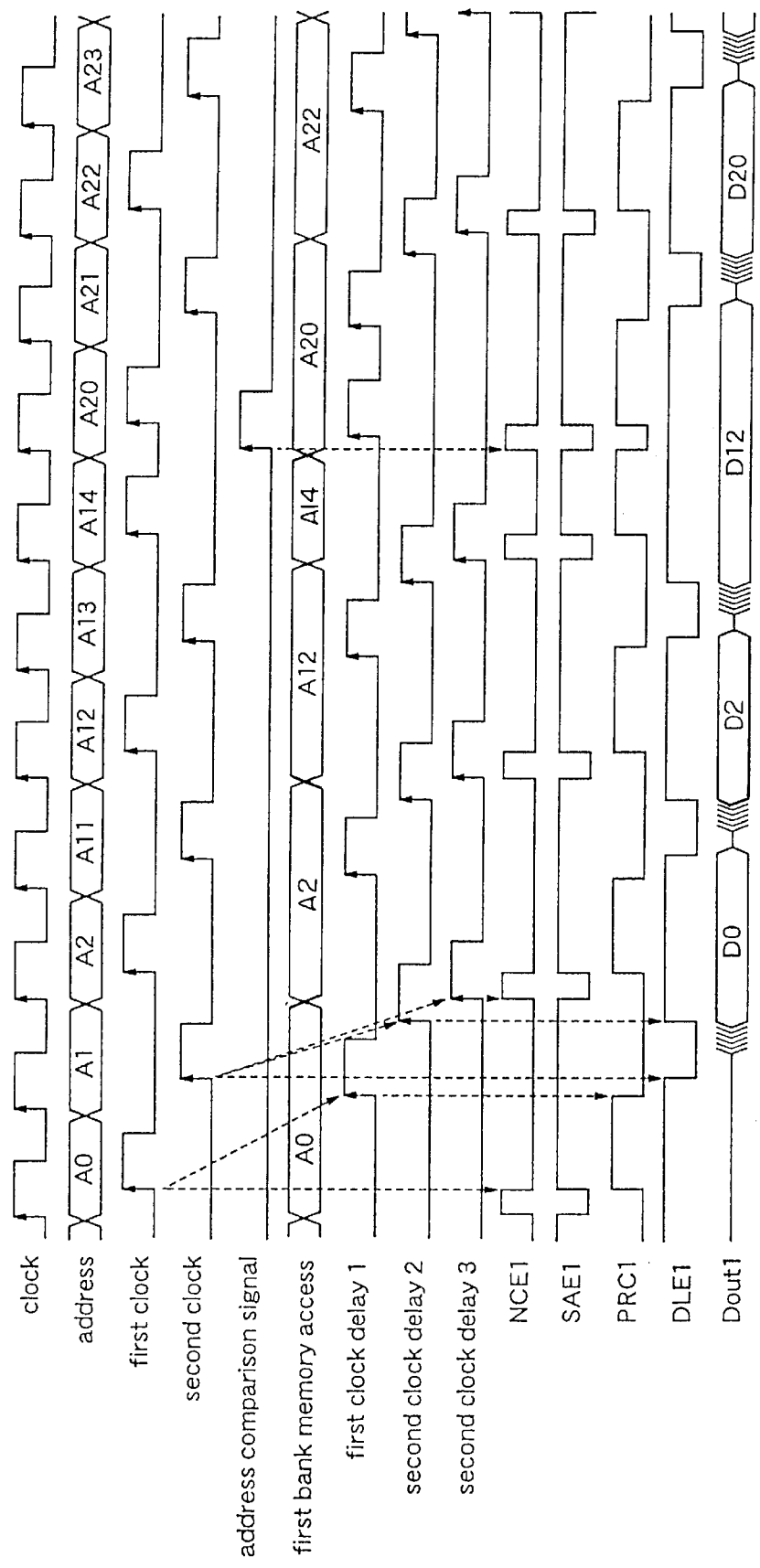
FIG. 15 is a timing chart for explaining the operation of the nonvolatile semiconductor memory according to the seventh embodiment.

A description is now given of the operation of the nonvolatile semiconductor memory constituted as described above. FIG. 15 is a timing chart for explaining the operation of the nonvolatile semiconductor memory of the seventh embodiment. In FIG. 15, "clock" is a reference clock input to the timing generation means 56, and "first clock" and "second clock" are the outputs of the selector 6 to be input to the first delay circuit 71 and the second delay circuit 72, respectively. Further, "first clock delay 1" is the output first delay circuit 71, and "second clock delay 2" and "second circuit clock delay 3" are the outputs of the second delay circuit 72. "NCE1", "SAE1", "PRC1", and "DLE1" are timing signals for the first bank memory 41, and "Dout1" is the output of the first bank memory 41. FIG. 15 is a timing chart relating to the first bank memory 41 and, hereinafter, the operation of the first bank memory 41 will be described with reference to FIG. 15.

The first clock output from the selector 6 is input to the first delay circuit 71, and the first delay circuit 71 outputs the input first clock as it is or as the first clock delay 1 (i.e., delayed first clock) to the first pulse generator 81. On the other hand, the second clock output from the selector 6 is input to the second delay circuit 72, and the second delay circuit 72 outputs the input second clock as it is or as the second clock delays 2 and 3 (i.e., delayed second clocks) to the first pulse generator 81. The address comparator 9 compares the bank address in the present clock cycle with the bank address in the previous clock cycle. When these addresses are addresses of the first bank memory 41 (a bank to which even addresses are assigned), the comparator 9 outputs a first identity signal as a first address comparison signal. That is, the address comparison signal (the first address comparison signal in FIG. 13) is output only when a jump is performed and the destination of this jump is an address in the same bank memory. The address comparison signal is input to the pulse generator 81.

With reference to FIG. 15, when a clock (reference clock) for address A0 is input to the selector 6, the selector 6 generates a first clock, and the first delay circuit 71 generates a first clock delay 1 which is a clock obtained by delaying the first clock. When a clock (reference clock) for address A1 is input to the selector 6, the selector 6 generates a second clock, and the second delay circuit 72 generates second clock delays 2 and 3 which are clocks obtained by delaying the second clock. Initially, in synchronization with rising of the first clock, the NCE1 becomes LOW and the SAE1 and the PRC1 become HIGH, whereby precharge on a word line and a bit line is started. Then, the PRC1 become LOW in synchronization with rising of the first clock delay 1, whereby the precharge is completed and sense operation takes place. Thereafter, in synchronization with rising of the second clock, the DLE1 becomes LOW and the data latch goes into the through state, whereby the output from the current detection means 3 is directly output to the output port. Thereafter, the DLE1 becomes HIGH in synchronization with rising of the second clock delay 2, whereby the output data is latched. Finally, in synchronization with rising of the second clock delay 3, the NCE1 becomes HIGH and the SAE becomes LOW, whereby the access is completed.

Usually, consecutive addresses are sequentially input for performing interleaving. Hence, the selector 6 outputs the first clock and the second clock alternately. In ordinary interleaving, since the addresses in the first bank memory and the addresses in the second bank memory are alternately input, no address comparison signal (output of the address comparator) is output. Therefore, the first and second bank memories alternately start access in each clock cycle according to rising of the first and second clocks as triggers, respectively, and alternately output data. Although each of the first and second bank memories makes access in two clock cycles, since these bank memories perform interleaving, in the whole memory data is output in each clock cycle.

Next, a description will be given of the case where access to consecutive addresses cannot be made because of a jump or the like.

When a jump to an address in a different bank memory is made, like a jump from an even address to an odd address or a jump from an odd address to an even address, the consecutively input addresses are addresses which reside in different bank memories. So, no address compare signal is output, and access operation identical to the ordinary interleaving operation is carried out. Accordingly, a penalty in this jump process is two clock cycles as in the conventional example shown in FIG. 23.

When a jump to an address in the same bank memory is made, like a jump from an even address to an even address or a jump from an odd address to an odd address, i.e. when addresses which reside in the same bank memory are consecutively input, the nonvolatile semiconductor memory operates as follows. FIG. 15 is a timing chart for explaining the operation in the case where a jump from address A12 to address 20 is made and thereby addresses A14 and A20 which reside in the first bank memory 41 are consecutively input. As shown in FIG. 15, when addresses A14 and A20 are consecutively input, the address comparator 9 detects that the addresses residing in the first bank memory are consecutively input, and outputs a first identity signal as a first address comparison signal. On receipt of the address comparison signal from the address comparator 9, the first pulse generator 81 sets the NCE1 and the DLE1 at HIGH and the SAE1 and the PRC1 at LOW to reset the access. Thereby, the access to address A14 is compulsorily terminated, and access to address A20 is immediately started. Therefore, a penalty due to a jump in the same bank memory, which penalty is equivalent to three clock cycles in the conventional memory, can be reduced to two clock cycles, resulting in higher-speed access operation.

In this seventh embodiment, the first clock is used for generating a timing signal to set the NCE1 at LOW and the SAE1 and PRC1 at HIGH, and a timing signal to set the PRC1 at LOW, while the second clock is used for generating a timing signal to set the DLE1 at LOW, a timing signal to set the DLE1 at HIGH, and a timing signal to set the NCE1 at HIGH and the SAE1 at LOW. On the other hand, in the jump process mentioned above, since address A20 is input after address A14, the second clock used for generating the above-mentioned timing signals for making access to address A14 is not generated, and therefore these timing signals are not generated. Accordingly, unnecessary data-through which occurs when these timing signal are generated, and malfunction can be avoided.

As described above, in the nonvolatile semiconductor memory according to the seventh embodiment, the timing generation means generates the timing signals to reset the access operation of the first bank memory when the addresses residing in the first bank memory are consecutively input, and generates the timing signals to reset the access operation of the second bank memory when the addresses residing in the second bank memory are consecutively input. Therefore, a penalty due to a jump in the same bank memory, which penalty is equivalent to three clock cycles in the conventional memory, can be reduced to two clock cycles, whereby high-speed access is realized in the case of using a random access memory such as a main storage memory of a microcomputer.

Further, in the nonvolatile semiconductor memory of the seventh embodiment, the access timing signals are generated by utilizing the clock for the other bank memory and its delay signals. Therefore, the absolute value of the delay time can be reduced, whereby each of the bank memories can be operated with highly precise timing signals in which variations of delays due to variations of elements or the like are reduced. Further, by appropriately selecting the timing signals which are generated by using the clock for the other bank memory and its delay signals, unnecessary data-through and malfunction can be avoided in the jump process.

While in this seventh embodiment the rising edge of the clock and its delay are used for timing generation, access timing signals may be generated by using various clock inputs and their delays, for example, both of the rising and falling edges may be employed, with the same effects as mentioned above.

Further, while in this seventh embodiment two bank memories are employed, three or more bank memories may be employed.

EMBODIMENT 8

Figure 16:
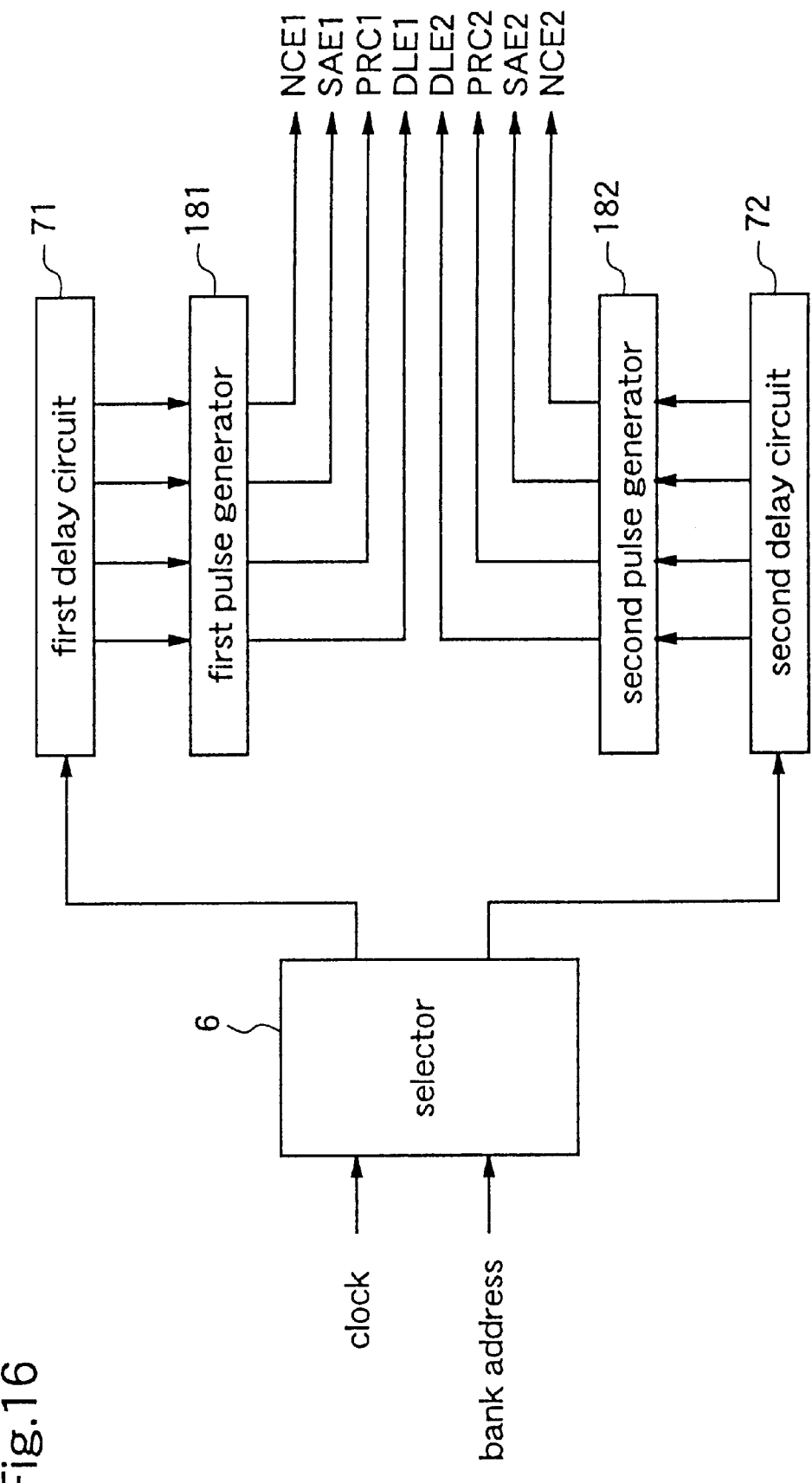
FIG. 16 is a block diagram illustrating the internal structure of a timing generation means included in a nonvolatile semiconductor memory according to an eighth embodiment of the present invention.

Next, a nonvolatile semiconductor memory according to an eighth embodiment of the present invention will be described. The structure of the nonvolatile semiconductor memory according to this eighth embodiment is fundamentally identical to that of the nonvolatile semiconductor memory according to the sixth embodiment shown in FIG. 11 except the internal structure of the timing generation means 56. FIG. 16 is a block diagram illustrating the internal structure of a timing generation means included in the nonvolatile semiconductor memory of this eighth embodiment. In FIG. 16, the same reference numerals as those shown in FIG. 12 denote the same or corresponding parts. Reference numeral 181 denotes a first pulse generator which receives the output of the first delay circuit 71, generates timing signals (NCE1, SAE1, PRC1, and DLE1) for operating the first bank memory, and outputs a timing signal for resetting the access operation of the first bank memory at the rising timing of the first clock which is output from the selector 6. Reference numeral 182 denotes a second pulse generator which receives the output of the second delay circuit 72, generates timing signals (NCE2, SAE2, PRC2, and DLE2) for operating the second bank memory, and outputs a timing signal for resetting the access operation of the second bank memory at the rising timing of the second clock which is output from the selector 6.

Figure 17:
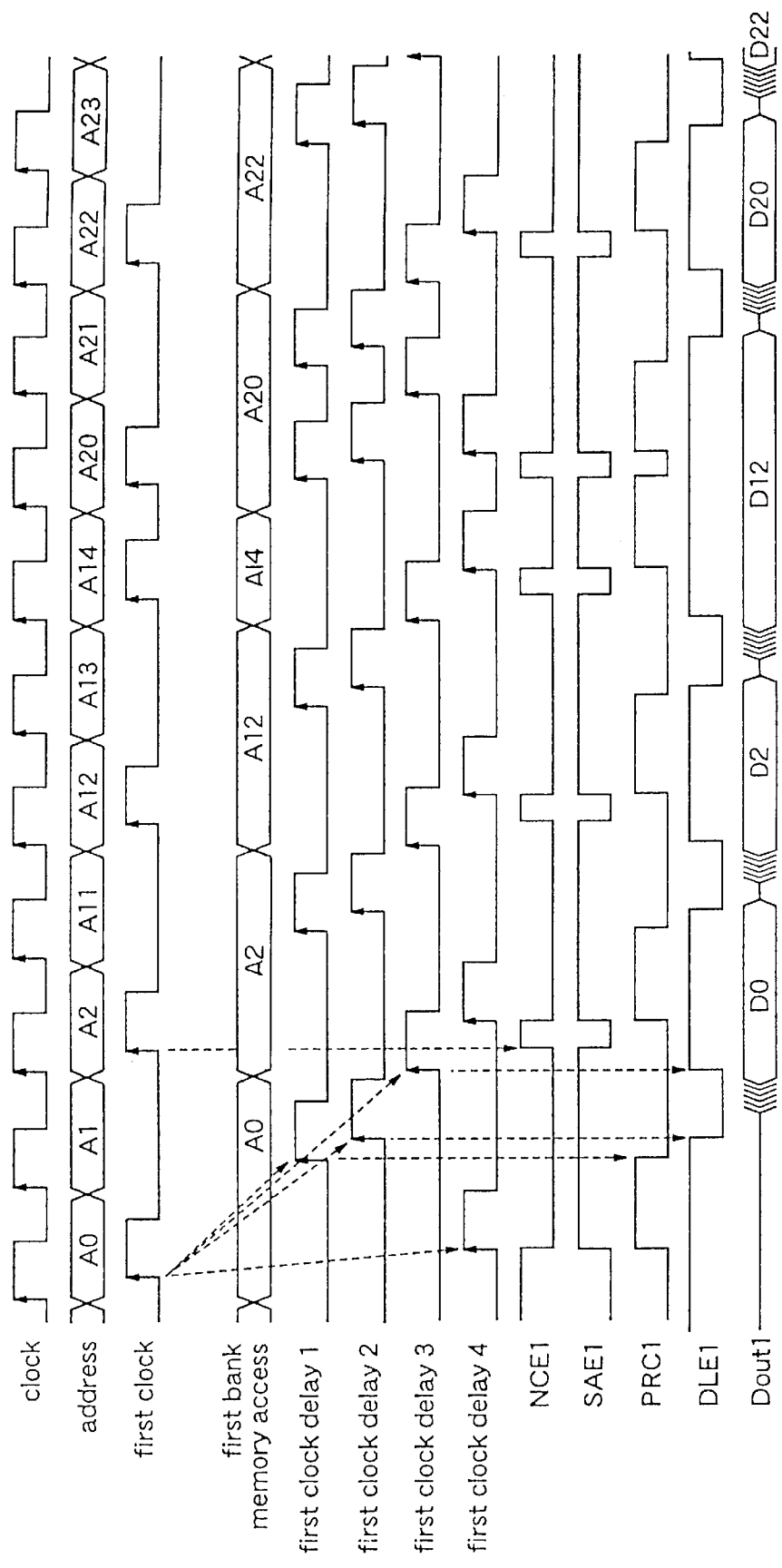
FIG. 17 is a timing chart for explaining the operation of the nonvolatile semiconductor memory according to the eighth embodiment.

A description is now given of the operation of the nonvolatile semiconductor memory constituted as described above. FIG. 17 is a timing chart for explaining the operation of the nonvolatile semiconductor memory of the eighth embodiment. In FIG. 17, "clock" is a reference clock input to the timing generation means 56, and "first clock" is the output from the selector 6 to be input to the first delay circuit 71. Further, "first clock delays 1–4" are the outputs from the first delay circuit 71. "NCE1", "SAE1", "PRC1", and "DLE1" are timing signals for the first bank memory 41, and "Dout1" is the output from the first bank memory 41. FIG. 15 is a timing chart relating to the first bank memory 41 and, hereinafter, the operation of the first bank memory 41 will be described with reference to FIG. 15.

The first clock output from the selector 6 is input to the first delay circuit 71, and the first delay circuit 71 outputs the input first clock as it is or as the first clock delays 1–4 (i.e., delayed first clocks) to the first pulse generator 181.

Turning to the FIG. 15, when the clock (reference clock) for address A0 is input to the selector 6, the selector 6 generates the first clock, and the first delay circuit 71 generates the first clock delays 1–4 which are clocks obtained by delaying the first clock. Initially, in synchronization with rising of the first clock, the NCE1 becomes LOW and the SAE1 becomes HIGH, whereby access is reset and the first bank memory 41 goes into the access waiting state.

Then, in synchronization with rising of the first clock delay 4, the DLE1 becomes LOW and the SAE1 and the PRC1 become HIGH, whereby precharge of a word line and a bit line is started. Thereafter, the PRC1 becomes LOW in synchronization with the first clock delay 1, whereby the precharge is completed and sense operation takes place. Thereafter, the DLE1 becomes LOW in synchronization with rising of the first clock delay 2. Thereby, the data latch goes into the through state, and the output from the current detection means 3 is directly output to the output port. Finally, the DLE1 becomes HIGH in synchronization with rising of the first clock delay 3, whereby the output data is latched and the access is completed.

Usually, consecutive addresses are sequentially input for performing interleaving. Hence, the selector 6 outputs the first clock and the second clock alternately. In ordinary interleaving, since the addresses in the first bank memory and the addresses in the second bank memory are alternately input, no address comparison signal (output of the address comparator) is output. Therefore, the first and second bank memories alternately start access in each clock cycle in accordance with rising of the first clock and the second clock as triggers, respectively, and alternately output data. Although each of the first and second bank memories makes access in two clock cycles, since these bank memories perform interleaving, in the whole memory data is output in each clock cycle.

Next, a description is given of the case where access to consecutive addresses cannot be made because of a jump or the like. In this case, after the first clock is input, the operation to reset access takes place, whereby access to an address just before an address to which a jump is made is compulsorily reset. As the result, a penalty due to a jump in the same bank memory, which penalty is equivalent to three clock cycles in the conventional memory, can be reduced to two clock cycles, whereby higher-speed access operation is realized.

In the nonvolatile semiconductor memory according to the eighth embodiment, since the first event of the access operation is always the reset operation, a signal for compulsorily resetting access, such as an address comparison signal (identity signal) used for the sixth and seventh embodiments, is not required.

As described above, according to the eighth embodiment, in the nonvolatile semiconductor memory performing. interleaving, the first event of the read access events for each bank memory is to reset the access operation. Therefore, a penalty due to a jump in the same bank memory, which penalty is equivalent to three clock cycles in the conventional memory, can be reduced to two clock cycles, whereby high-speed access is realized in the case of using a random access memory such as a main storage memory of a microcomputer.

Further, in the nonvolatile semiconductor memory according to the eighth embodiment, since the first event of the access operation is always the reset operation, a signal for compulsorily resetting access, such as an address comparison signal (identity signal) used for the sixth and seventh embodiments, is not required, whereby the structure of the apparatus is simplified.

While in this eighth embodiment the rising edge of the clock and its delay are utilized for timing generation, access timing signals may be generated by using various clock inputs and their delays, for example, both the rising edge and the falling edge may be used, with the same effects as mentioned above.

Further, access timing signals may be generated by using a clock for the other bank memory and its delay.

Furthermore, while in this eighth embodiment two bank memories are employed, three or more bank memories may be employed.

EMBODIMENT 9

Figure 18:
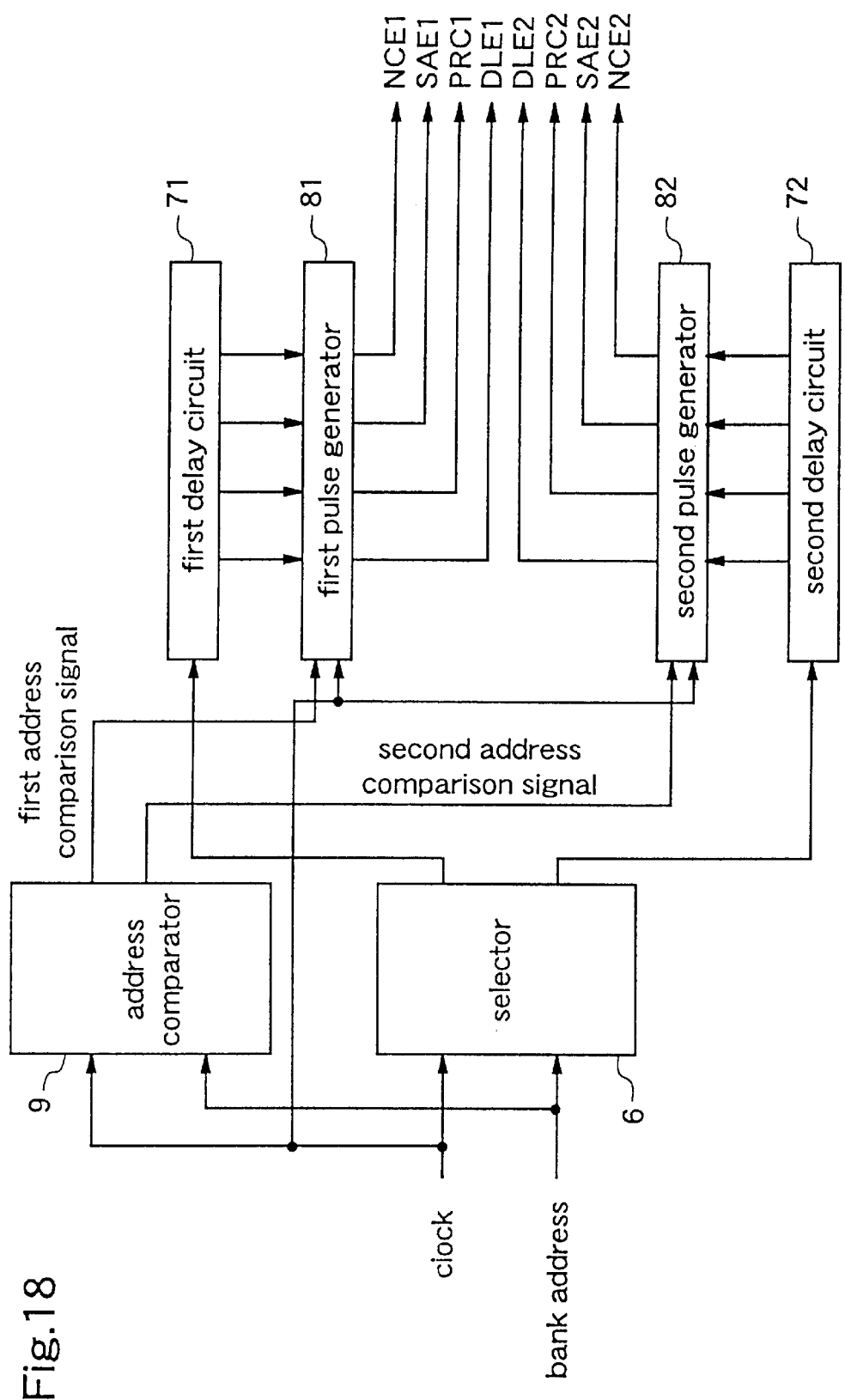
FIG. 18 is a block diagram illustrating the internal structure of a timing generation means included in a nonvolatile semiconductor memory according to a ninth embodiment of the present invention.

Hereinafter, a nonvolatile semiconductor memory according to a ninth embodiment of the invention will be described. The structure of the nonvolatile semiconductor memory according to this ninth embodiment is fundamentally identical to that of the nonvolatile semiconductor memory according to the sixth embodiment shown in FIG. 11 except the internal structure of the timing generation means 56. FIG. 18 is a block diagram illustrating the internal structure of a timing generation means included in the nonvolatile semiconductor memory of this ninth embodiment. In FIG. 18, the same reference numerals as those shown in FIG. 12 denote the same or corresponding parts. The timing generation means according to the ninth embodiment shown in FIG. 18 is different from the timing generation means according to the sixth embodiment shown in FIG. 12 in that a clock (reference clock) is input to the first pulse generator 81 and the second pulse generator 82.

Figure 19:
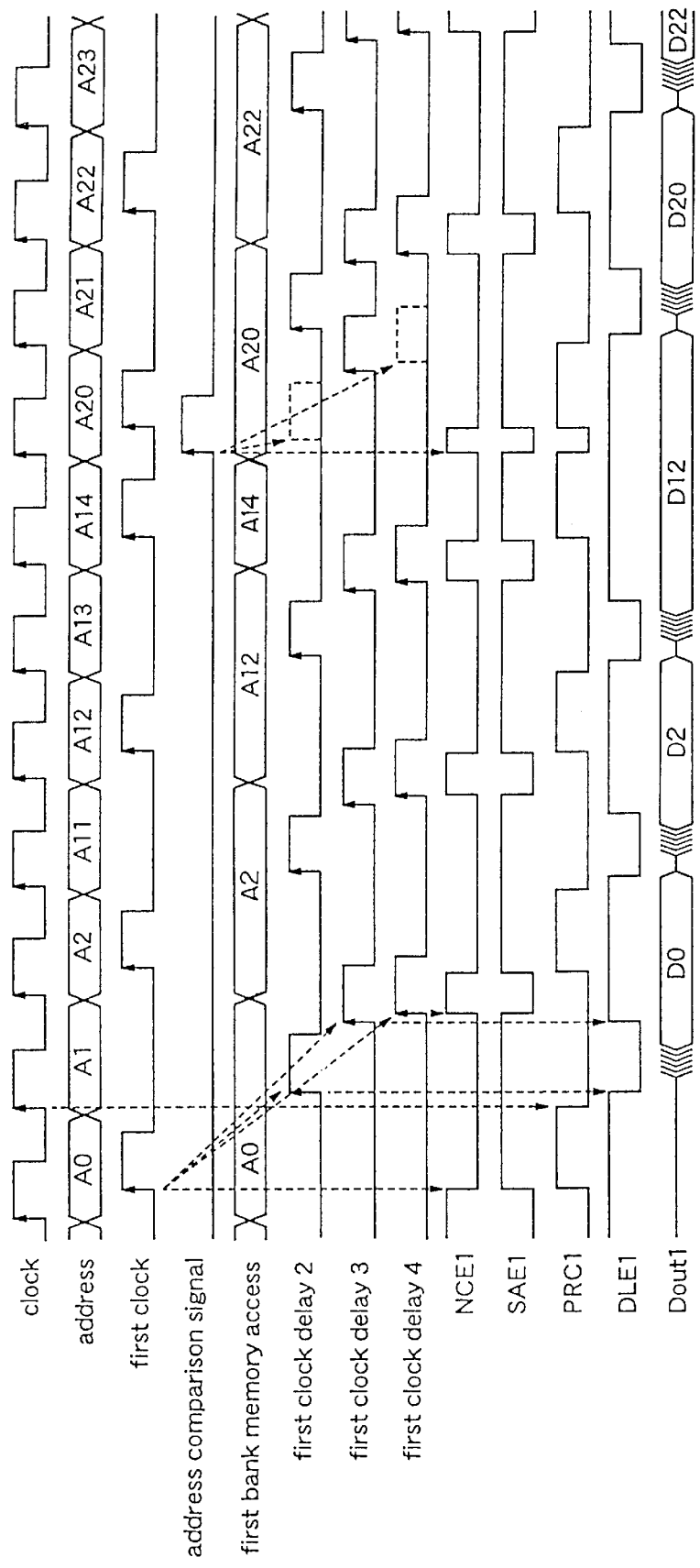
FIG. 19 is a timing chart for explaining the operation of the nonvolatile semiconductor memory according to the ninth embodiment.

A description is now given of the operation of the nonvolatile semiconductor memory constituted as described above. FIG. 19 is a timing chart for explaining the operation of the nonvolatile semiconductor memory of the ninth embodiment. In FIG. 19, "clock" is a reference clock input to the timing generation means 56, and "first clock" is the output of the selector 6 to be input to the first delay circuit 71. Further, "first clock delays 2–4" are outputs of the first delay circuit 71. "NCE1", "SAE1", "PRC1", and "DLE1" are timing signals for the first bank memory 41, and "Dout1" is the output of the first bank memory 41. FIG. 19 is a timing chart relating to the first bank memory 41.

The first clock output from the selector 6 is input to the first delay circuit 71, and the first delay circuit 71 outputs the input first clock as it is or as the first clock delays 2–4 (i.e., delayed first clocks) to the first pulse generator 81. The address comparator 9 compares the bank address in the present clock cycle with the bank address in the previous clock cycle. When these addresses are addresses of the first bank memory 41 (a bank to which even addresses are assigned), the comparator 9 outputs a first identity signal as a first address comparison signal. That is, the address comparison signal (the first address comparison signal in FIG. 19) is output only when a jump is performed and the destination of the jump is an address in the same bank memory. The address comparison signal is input to the pulse generator 81.

With reference to FIG. 19, when a clock (reference clock) for address A0 is input to the selector 6, the selector 6 generates a first clock, and the first delay circuit 71 generates first clock delays 2–4 which are clocks obtained by delaying the first clock. Initially, in synchronization with rising of the first clock, the NCE1 becomes LOW and the SAE1 and the PRC1 become HIGH, whereby precharge on a word line and a bit line is started. Then, the PRC1 becomes LOW in synchronization with rising of the reference clock, whereby the precharge is completed and sense operation takes place. Thereafter, in synchronization with rising of the first clock delay 2, the DLE1 becomes LOW and the data latch goes into the through state, whereby the output from the current detection means 3 is directly output to the output port. Thereafter, the DLE1 becomes HIGH in synchronization with rising of the first clock delay 3, whereby the output data is latched. Finally, in synchronization with rising of the first clock delay 4, the NCE1 becomes HIGH and the SAE becomes LOW, whereby the access is completed.

As described above, in the nonvolatile semiconductor memory of the ninth embodiment, the PRC signal is set to LOW in synchronization with rising of the clock whose cycle is predetermined (reference clock) to complete the precharge operation. Thereby, variations of delays due to variations of elements can be reduced, and each of the bank memories can be operated with the timing signals of higher precision. Further, reduction in the delay signals is also achieved. While in this ninth embodiment the reference clock is used as a timing to complete precharge, it can be used as a timing to start through of data latch.

Usually, consecutive addresses are sequentially input for performing interleaving. Hence, the selector 6 outputs the first clock and the second clock alternately. In ordinary interleaving, since the addresses in the first bank memory and the addresses in the second bank memory are alternately input, no address comparison signal (output of the address comparator) is output. Therefore, the first and second bank memories alternately start access in each clock cycle according to rising of the first an second clocks as triggers, respectively, and alternately output data. Although each of the first and second bank memories makes access in two clock cycles, since these bank memories perform interleaving, in the whole memory data is output in each clock cycle.

Next, a description will be given of the case where access to consecutive addresses cannot be made because of a jump or the like.

When a jump to an address in a different bank memory is made, like a jump from an even address to an odd address or a jump from an odd address to an even address, the consecutively input addresses are addresses which reside in different bank memories. So, no address compare signal is output, and access operation identical to the ordinary interleaving operation is carried out. Accordingly, a penalty in this jump process is two clock cycles as in the conventional example shown in FIG. 23.

When a jump to an address in the same bank memory is made, like a jump from an even address to an even address or a jump from an odd address to an odd address, i.e., when addresses which reside in the same bank memory are consecutively input, the nonvolatile semiconductor memory operates as follows. FIG. 19 is a timing chart for explaining the operation in the case where a jump from address A12 to address A20 is made and thereby addresses A14 and A20 which reside in the first bank memory 41 are consecutively input. As shown in FIG. 19, when addresses A14 and A20 are consecutively input, the address comparator 9 detects that the addresses residing in the first bank memory are consecutively input, and outputs a first identity signal as a first address comparison signal. On receipt of the address comparison signal from the address comparator 9, the first pulse generator 81 sets the NCE1 and the DLE1 at HIGH and the SAE1 and the PRC1 at LOW to reset the access. Thereby, the access to address A14 is compulsorily terminated, and access to address A20 is immediately started. Therefore, a penalty due to a jump in the same bank memory, which penalty is equivalent to three clock cycles in the conventional memory can be reduced to two clock cycles, resulting in higher-speed access operation.

The first pulse generator 81 generates the timing signals so as to compulsorily reset the access by the address comparison signal (first address comparison signal). When the first delay circuit 71 outputs the delay signals of the first clock for address A14 as usual, a part of the first clock delay 2 shown by the dotted line and a part of the first clock delay 4 shown by the dotted line are output as well. However, when the first pulse generator 81 outputs the DLE1 set at LOW in accordance with the dotted-line part of the first clock delay 2, unnecessary data-through occurs. Further, when the first pulse generator 81 outputs the NCE1 set HIGH and the SAE1 set at LOW in accordance with the dotted-line part of the first clock delay 4, reset takes place while access to address A20 is made, resulting in malfunction. So, on receipt of the address comparison signal (first identity signal), the first pulse generator 81 cancels the pulses of the first clock delays 2 and 4. Thereby, unnecessary data-through and malfunction are avoided.

As described above, according to the ninth embodiment of the invention, in the nonvolatile semiconductor memory performing interleaving, part or all of the timing signals output from the timing generation means is set or reset with the reference clock. Therefore, variations of delays due to variations of elements or the like can be reduced, whereby each of the bank memories can be operated with the timing signals of higher precision. Further, the delay signals to be created for timing signal generation can be reduced.

In this ninth embodiment of the invention, the first and second clocks are obtained according to the input clock based on the bank address, and the first and second bank memories are operated at timings synchronized with rising of these first and second clocks and at timings obtained by delaying these first and second clocks. However, each of the bank memories may be operated at timings generated by using plural clocks as described for the first and second embodiments.

While in this ninth embodiment the rising edge of the clock and its delay are used for timing generation, access timing signals may be generated by using various clock inputs and their delays, for example, both of the rising and falling edges may be employed, with the same effects as mentioned above.

Further, while in this ninth embodiment two bank memories are employed, three or more bank memories may be employed.

What is claimed is:

1. A nonvolatile semiconductor memory, comprising:
   a memory core unit, comprising:
      a memory cell array in which a plurality of memory cells are arranged as a matrix having rows and columns,
      an address decoding unit operable to select one of said plurality of memory cells according to a row address and a column address, and
      a current detection device operable to detect a current flowing in said one of said plurality of memory cells selected by said address decoding unit; and
   a timing generation device operable to provide timing signals to said memory core unit for performing an access operation, said timing generation device comprising first and second clocks having a same cycle and different phases, wherein the phase of said first clock precedes the phase of said second clock and wherein said timing generation device is operable to generate timing signals used to process at least one first-half event among a plurality of read access events according to said first clock.

2. A nonvolatile semiconductor memory claimed in claim 1, wherein:
   said memory core unit comprises a plurality of bank memories, wherein each of said plurality of bank memories comprises a memory cell array in which a plurality of memory cells are arranged as a matrix having rows and columns;
   said current detection device is operable to receive addresses such that said plurality of bank memories sequentially perform access operations when consecutive addresses are input into said plurality of memory cells in said plurality of bank memories; and
   said timing generation device is operable to receive as an input, a bank address used to select one of said plurality of bank memories and is operable to generate timing signals which make said plurality of bank memories perform interleaving operations.

3. A nonvolatile semiconductor memory, comprising:
   a memory core unit, comprising:
      a memory cell array in which a plurality of memory cells are arranged as a matrix having rows and columns,
      an address decoding unit operable to select one of said plurality of memory cells according to a row address and a column address, and
      a current detection device operable to detect a current flowing in said one of said plurality of memory cells selected by said address decoding unit; and
   a timing generation device operable to provide timing signals to said memory core unit for performing an access operation, said timing generation device comprising a plurality of clocks having a same cycle and different phases, wherein the phase of a first clock precedes a phase of at least one other clock of said plurality of clocks and wherein said timing generation device is operable to generate timing signals used to process at least one first-half event among a plurality of read access events according to said first clock and is operable to generate timing signals used to process remaining access events according to said at least one other clock.

4. A nonvolatile semiconductor memory claimed in claim 3, wherein said timing generation device is operable to generate timing signals used to process at least one first-half event among a plurality of read access events according to a first edge corresponding to either a rising edge or a falling edge of one pulse of at least one clock of said plurality of clocks and is further operable to generate timing signals used to process remaining access events according to a second edge corresponding to either the rising edge or the falling edge of said at least one clock not corresponding to the first edge.

5. A nonvolatile semiconductor memory claimed in claim 4, wherein
   said memory core unit comprises a plurality of bank memories, wherein each of said plurality of bank memories comprises a memory cell array in which a plurality of memory cells are arranged as a matrix having rows and columns;
   said current detection device is further operable to receive addresses such that said plurality of bank memories sequentially perform access operations when consecutive addresses are input into said plurality of memory cells in said plurality of bank memories; and
   said timing generation device is operable to receive as an input, a bank address used to select one of said plurality of bank memories and is operable to generate timing signals which make said plurality of bank memories sequentially perform interleaving operations.

6. A nonvolatile semiconductor memory claimed in claim 3, wherein said memory core unit comprises a plurality of bank memories, wherein each of said plurality of bank memories comprises a memory cell array in which a plurality of memory cells are arranged as a matrix having rows and columns;

said current detection device is further operable to receive addresses such that said plurality of bank memories sequentially perform access operations when consecutive addresses are input into said plurality of memory cells in said plurality of bank memories; and said timing generation device is operable to receive as an input, a bank address used to select one of said plurality of bank memories and is operable to generate timing signals which make said plurality of bank memories sequentially perform interleaving operations.

7. A nonvolatile semiconductor memory, comprising:

a memory core unit, comprising:
- a plurality of bank memories, wherein each of said plurality of bank memories comprises a memory cell array in which a plurality of memory cells are arranged as a matrix having rows and columns;
- an address decoding unit operable to select one of said plurality of memory cells according to a row address and a column address, and
- a current detection device operable to detect a current flowing in said one of said plurality of memory cells selected by said address decoding unit, wherein said current detection device is operable to receive addresses such that said plurality of bank memories sequentially perform access operations when consecutive addresses are input into said plurality of memory cells in said plurality of bank memories; and a timing generation device operable to provide timing signals to said memory core unit for performing an access operation, said timing generation device comprising a single-phase clock, wherein said timing generation device is operable to generate timing signals used to process at least one first-half event among a plurality of read access events according to a first edge corresponding to one of a rising edge or a falling edge of one pulse of said single-phase clock and is operable to generate timing signals used to process remaining access events according to a second edge corresponding to the other of the rising edge or the falling edge of said single-phase clock, wherein said timing generation device is operable to receive as an input, a bank address used to select one of said plurality of bank memories and is operable to generate timing signals which make said plurality of bank memories sequentially perform interleaving operations.

8. A nonvolatile semiconductor memory, comprising:

a first bank memory comprising a memory cell array in which a plurality of memory cells are arranged as a matrix having rows and columns, said first memory bank being assigned only even addresses;

a second bank memory comprising a memory cell array in which a plurality of memory cells are arranged as a matrix having rows and columns, said second memory bank being assigned only odd addresses;

an address decoding unit operable to select a memory cell according to a row address and a column address;

a current detection device operable to detect a current flowing in said memory cell selected by said address decoding unit; and a timing generation device operable to generate timing signals which make said first and second bank memories alternately perform interleaving operations, operable to generate timing signals to reset an access operation of said first bank memory when addresses of said first bank memory are input sequentially, and further operable to generate timing signals to reset an access operation of said second bank memory when addresses of said second bank memory are input sequentially.

9. A nonvolatile semiconductor memory, comprising:

a first bank memory comprising a memory cell array in which a plurality of memory cells are arranged as a matrix having rows and columns, said first memory bank being assigned only even addresses;

a second bank memory comprising a memory cell array in which a plurality of memory cells are arranged as a matrix having rows and columns, said second memory bank being assigned only odd addresses;

an address decoding unit operable to select a memory cell according to a row address and a column address;

a current detection device operable to detect a current flowing in said memory cell selected by said address decoding unit; and a timing generation device operable to generate timing signals which make said first and second bank memories alternately perform interleaving operations, operable to generate timing signals to reset an access operation of said first bank memory when addresses of said first bank memory are input sequentially, and further operable to generate timing signals to reset an access operation of said second bank memory when addresses of said second bank memory are input sequentially, wherein said timing generation device comprises:

an address comparator operable to receive a reference clock and a bank address used for selecting one of said first and second bank memories as inputs, operable to compare a bank address in a current cycle of the reference clock with a bank address in a cycle of the reference clock immediately prior to the current cycle, operable to output a first identity signal when the bank address in the current cycle and the bank address in the cycle immediately prior to the current cycle are addresses of said first memory bank, and operable to output a second identity signal when the bank address in the current cycle and the bank address in the cycle immediately prior to the current cycle are addresses of said second memory bank;

a selector operable to receive the reference clock and the bank address used for selecting one of said first and second bank memories as inputs, and operable to generate a clock based on the reference clock to be used by either said first or second bank memory depending on which one is specified by the bank address;

a first delay circuit operable to receive the clock for said first bank memory output by said selector, and operable to delay the clock to generate at least one delayed signal;

a second delay circuit operable to receive the clock for said second bank memory output by said selector, and operable to delay the clock to generate at least one delayed signal;

a first pulse generator operable to receive the at least one delayed signal from said first delay circuit and the first identity signal, operable to generate timing signals for accessing said first bank memory according to the at least one delay signal from said first delay circuit, and operable to generate timing signals for resetting an access operation of said first bank memory when receiving the first identity signal as an input; and a second pulse generator operable to receive the at least one delayed signal from said second delay circuit and the second identity signal, operable to generate timing signals for accessing said second bank memory according to the at least one delay signal from said second delay circuit, and operable to generate timing signals for resetting an access operation of said second bank memory when receiving the second identity signal as an input.

10. A nonvolatile semiconductor memory, comprising:

a first bank memory comprising a memory cell array in which a plurality of memory cells are arranged as a matrix having rows and columns, said first memory bank being assigned only even addresses;

a second bank memory comprising a memory cell array in which a plurality of memory cells are arranged as a matrix having rows and columns, said second memory bank being assigned only odd addresses;

an address decoding unit operable to select a memory cell according to a row address and a column address;

a current detection device operable to detect a current flowing in said memory cell selected by said address decoding unit; and a timing generation device operable to generate timing signals which make said first and second bank memories alternately perform interleaving operations, operable to generate timing signals to reset an access operation of said first bank memory when addresses of said first bank memory are input sequentially, and further operable to generate timing signals to reset an access operation of said second bank memory when addresses of said second bank memory are input sequentially, wherein said timing generation device comprises:

an address comparator operable to receive a reference clock and a bank address used for selecting one of said first and second bank memories as inputs, operable to compare a bank address in a current cycle of the reference clock with a bank address in a cycle of the reference clock immediately prior to the current cycle, operable to output a first identity signal when the bank address in the current cycle and the bank address in the cycle immediately prior to the current cycle are addresses of said first memory bank, and operable to output a second identity signal when the bank address in the current cycle and the bank address in the cycle immediately prior to the current cycle are addresses of said second memory bank;

a selector operable to receive the reference clock and the bank address used for selecting one of said first and second bank memories as inputs, and operable to generate a clock based on the reference clock to be used by either said first or second bank memory depending on which one is specified by the bank address;

a first delay circuit operable to receive the clock for said first bank memory output by said selector, and operable to delay the clock to generate at least one delayed signal;

a second delay circuit operable to receive the clock for said second bank memory output by said selector, and operable to delay the clock to generate at least one delayed signal;

a first pulse generator operable to receive the at least one delayed signal from said first delay circuit, the at least one delayed signal from said second delay circuit, and the first identity signal, operable to generate timing signals for accessing said first bank memory according to the at least one delay signal from said first delay circuit and the at least one delay signal from said second delay circuit, and operable to generate timing signals for resetting an access operation of said first bank memory when receiving the first identity signal as an input; and a second pulse generator operable to receive the at least one delayed signal from said second delay circuit, the at least one delayed signal from said second delay circuit, and the second identity signal, operable to generate timing signals for accessing said second bank memory according to the at least one delay signal from said second delay circuit and the at least one delay signal from said first delay circuit, and operable to generate timing signals for resetting an access operation of said second bank memory when receiving the second identity signal as an input.

11. A nonvolatile semiconductor memory, comprising:

a first bank memory comprising a memory cell array in which a plurality of memory cells are arranged as a matrix having rows and columns, said first memory bank being assigned only even addresses;

a second bank memory comprising a memory cell array in which a plurality of memory cells are arranged as a matrix having rows and columns, said second memory bank being assigned only odd addresses;

an address decoding unit operable to select a memory cell according to a row address and a column address;

a current detection device operable to detect a current flowing in said memory cell selected by said address decoding unit; and a timing generation device operable to generate timing signals which make said first and second bank memories alternately perform an interleaving operation, wherein a first event of read access events for each of said first and second bank memories is a reset of an access operation.

12. A nonvolatile semiconductor memory, comprising:

a first bank memory comprising a memory cell array in which a plurality of memory cells are arranged as a matrix having rows and columns, said first memory bank being assigned only even addresses;

a second bank memory comprising a memory cell array in which a plurality of memory cells are arranged as a matrix having rows and columns, said second memory bank being assigned only odd addresses;

an address decoding unit operable to select a memory cell according to a row address and a column address;

a current detection device operable to detect a current flowing in said memory cell selected by said address decoding unit; and a timing generation device operable to receive a reference clock and a bank address as inputs to generate timing signals which make said first and second bank memories alternately perform an interleaving operation, and further operable to generate timing signals to reset an